(12) United States Patent
Helm

(10) Patent No.: US 6,647,542 B2
(45) Date of Patent: Nov. 11, 2003

(54) EFFICIENT FABRICATION PROCESS FOR DUAL WELL TYPE STRUCTURES

(75) Inventor: Mark A. Helm, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/121,694

(22) Filed: Apr. 15, 2002

(65) Prior Publication Data

US 2002/0137272 A1 Sep. 26, 2002

Related U.S. Application Data

(63) Continuation of application No. 09/901,035, filed on Jul. 10, 2001, now Pat. No. 6,396,100, which is a continuation of application No. 09/311,632, filed on May 14, 1999, now Pat. No. 6,268,250.

(51) Int. Cl.[7] ............................................... G06F 17/50
(52) U.S. Cl. ........................... 716/19; 716/21; 257/371; 257/374; 257/396; 257/657; 257/315
(58) Field of Search .............................. 716/19, 20, 21; 257/371, 374, 396, 657, 315

(56) References Cited

U.S. PATENT DOCUMENTS

| | | |
|---|---|---|
| 5,428,239 A | 6/1995 | Okumura et al. |
| 5,726,488 A | 3/1998 | Watanabe et al. |
| 5,753,956 A | 5/1998 | Honeycutt et al. |
| 5,773,863 A | 6/1998 | Burr et al. |
| 5,814,866 A | 9/1998 | Borland |
| 5,821,153 A | 10/1998 | Tsai et al. |
| 5,830,795 A | 11/1998 | Mehta et al. |
| 5,851,863 A | 12/1998 | Fujii et al. |
| 5,851,864 A | 12/1998 | Ito et al. |
| 5,960,274 A | 9/1999 | Mehta |
| 5,962,888 A * | 10/1999 | Kim et al. ............... 257/315 |
| 5,994,733 A * | 11/1999 | Nishioka et al. ........... 257/316 |
| 6,005,797 A | 12/1999 | Porter et al. |
| 6,090,652 A | 7/2000 | Kim |
| 6,242,294 B1 * | 6/2001 | Mitani et al. ............. 438/228 |
| 6,268,633 B1 * | 7/2001 | Pio et al. .................. 257/391 |

OTHER PUBLICATIONS

H. Watanabe, et al., "NOVEL 0.44 $\mu m^2$ Ti–Salicide STI Cell Technology for High–Density NOR Flash Memories and high Performance Embedded Application," IEEE, 5 pages, 1998.

* cited by examiner

Primary Examiner—Vuthe Siek
Assistant Examiner—Sun James Lin
(74) Attorney, Agent, or Firm—Dickstein Shapiro Morin & Oshinsky LLP

(57) ABSTRACT

An efficient method for fabricating dual well type structures uses the same number of masks used in single well type structure fabrication. In a preferred embodiment, the current invention allows low voltage and high voltage n-channel transistors and low voltage and high voltage p-channel transistors to be formed in a single substrate. One mask is used for forming a diffusion well, a second mask for both forming a retrograde well and doping the well to achieve an intermediate threshold voltage in that well, and a third mask for both differentiating the gate oxides for the low voltage devices and doping the threshold voltages to achieve the final threshold voltages.

8 Claims, 28 Drawing Sheets

(a)

EFFICIENT FABRICATION PROCESS FOR DUAL WELL TYPE STRUCTURES

The present Application is a continuation of application Ser. No. 09/901,035, filed Jul. 10, 2001 (Issued as U.S. Pat. No. 5,396,100 on May. 28, 2002, which is in turn a continuation of application Ser. No. 09/311,632, filed May 14, 1999 (Issued as U.S. Pat. No. 6,268,250 B1 on Jul. 31, 2001), the disclosures of which are herewith incorporated in their entirety.

BACKGROUND OF THE INVENTION

1. Field of the Invention

The present invention relates generally to the field of integrated circuit fabrication, and more specifically to a fabrication process for use when two well types are required on a single integrated circuit.

2. Description of the Related Art

It is often necessary or desirable to fabricate both n-type and p-type devices on a single substrate. In order to fabricate both types of devices in a single substrate, typically a large area of a substrate of one type is doped to the other type. This large area is referred to as a "well." For example, FIG. 1 illustrates a portion 100 of an integrated circuit on a p-type substrate 110. The substrate 110 has an n-well (a well formed of n-type material) 120 formed therein. Inside the n-well 120 are a p-type source 141 and drain 142 on either side of a gate stack 150, which is formed of a gate dielectric 151, a gate electrode 158 and an insulating cap 159. Together, the gate stack 150 and the source and drain 141, 142 form a p-type field effect transistor 160. Field oxide regions 130 isolate the transistor 160 from other devices on the substrate 110.

Conventional wells are formed by implanting dopants at the well locations and then diffusing them (usually through a thermal process) to the desired depth. Such wells are also referred to as diffusion wells for this reason. One drawback associated with diffusion wells is that the diffusion occurs laterally as well as vertically, e.g. the diffusion well gets wider as it gets deeper. A second drawback associated with diffusion wells is that relatively large spaces between the edges of the wells and device active areas is required.

A second type of well, referred to as a retrograde well, attempts to overcome the lateral spreading problem by implanting high energy dopants to the desired depth so that thermal diffusion is not necessary. Retrograde wells require less space between the edges of the well and device active areas than required by diffusion wells. Retrograde wells are therefore desirable for high density applications.

In certain applications, it makes sense to use both well types on a single integrated circuit. For example, in flash memory applications, which contain a low voltage peripheral circuit portion and a high voltage peripheral circuit portion, it is desirable to have the low voltage peripheral circuit portion implemented in retrograde wells and the high voltage peripheral circuit portion implemented in conventional diffusion wells. This type of structure is discussed in Watanabe et al., "Novel 0.44 $\mu m^2$ Ti-Salicide STI Technology for High Density NOR Flash Memories and High Performance Embedded Application," IEDM 98-975 (IEEE 1998). Another example of a device using both diffusion and retrograde wells on a single integrated circuit is described in U.S. Pat. No. 5,428,239, to Okamura et al.

Although these references disclose use of dual well type structures, they do not disclose an efficient method for fabricating such structures. Thus, integrated circuit manufacturers are faced with choosing between the benefits of using a dual well type structure one hand and the less complicated fabrication processes required for single well type structures on the other hand.

What is needed is an efficient method for fabricating a dual well type structure.

SUMMARY OF THE INVENTION

The invention overcomes to a great extent the aforementioned problems by providing an efficient method for fabricating structures with two types of wells which uses the same number of masks as used in single well type structure fabrication. In a preferred embodiment, the current invention allows low voltage and high voltage n-channel transistors and low voltage and high voltage p-channel transistors to be formed in a single substrate. One mask is used for forming a diffusion well, a second mask for both forming a retrograde well and doping the retrograde well to achieve an intermediate threshold voltage in that well, and a third mask for both differentiating the gate oxides for the low voltage devices and doping the areas of the substrate corresponding to the low voltage devices to achieve the final threshold voltages.

BRIEF DESCRIPTION OF THE DRAWING

The foregoing and other advantages and features of the invention will become more apparent from the detailed description of the preferred embodiments of the invention given below with reference to the accompanying drawing in which.

DETAILED DESCRIPTION OF THE PREFERRED EMBODIMENTS

Figure 1:
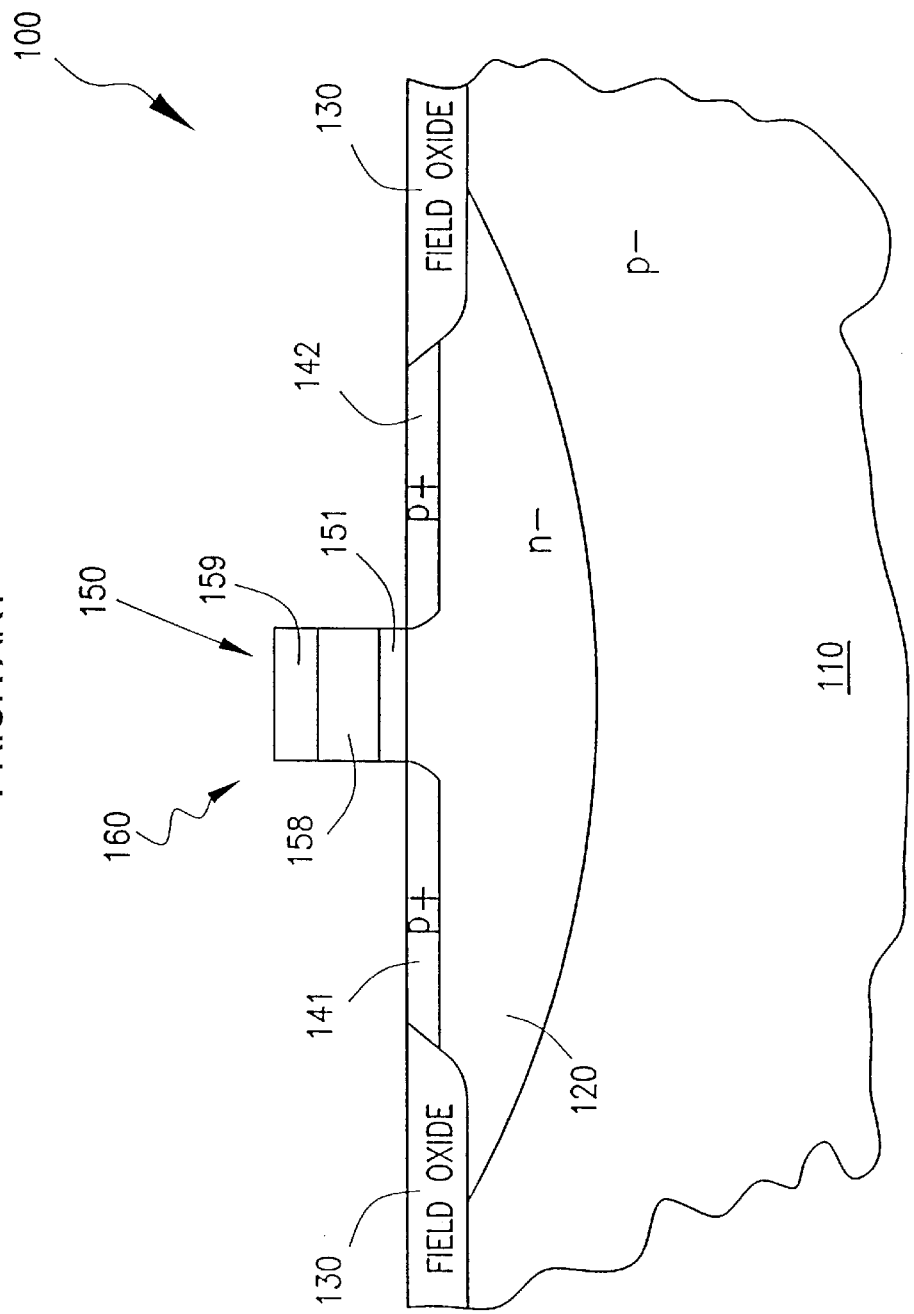
FIG. 1 is a cross-sectional diagram of a portion of an integrated circuit having a field effect transistor formed in a conventional diffusion well.

The present invention will be illustrated through a description of the fabrication of a portion of an integrated circuit containing two types of wells, diffusion and retrograde, for high voltage and low voltage devices, respectively. Numerous specific details, such as materials, thicknesses, etc., are set forth in order to provide a thorough understanding of the present invention. It will be obvious, however, to one skilled in the art that the present invention is capable of many different embodiments and that the present invention may be practiced without the specific details set forth herein. Accordingly, the drawing and description herein are to be regarded as illustrative in nature and not as restrictive.

Figure 28:
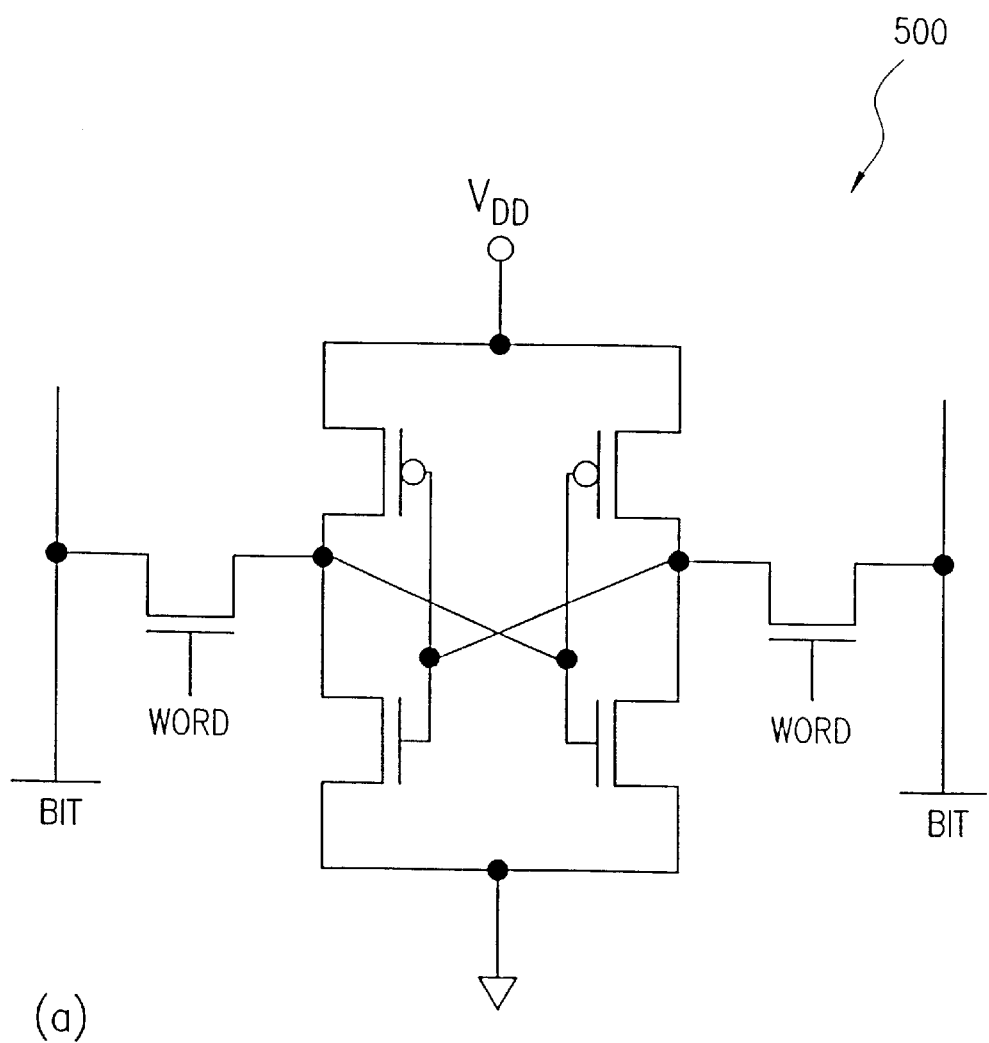
FIG. 28 is a circuit diagram of a six transistor SRAM cell.

A prior art process for fabricating both low and high voltage field effect transistors in diffusion wells will be illustrated first. It should be noted that the drawings herein are not to scale. This is especially true of the thickness of the gate oxide regions. It should also be appreciated that the following drawings illustrate wells with only a single transistor therein solely for the purpose of illustrating fabrication processes. Those of ordinary skill in the art will appreciate that, in practice, two or more devices, and often many devices, are placed in a single well. For example, in SRAM memory circuit applications, a common configuration for an SRAM memory cell 500 consists of 4 n-channel transistors and 2 p-channel transistors, as shown in FIG. 28, formed on a p-substrate. Typically, a single n-well is formed for the two p-channel devices. However, in the peripheral portion of the circuit, it is common to have many p-channel devices in a single well.

Figure 2:
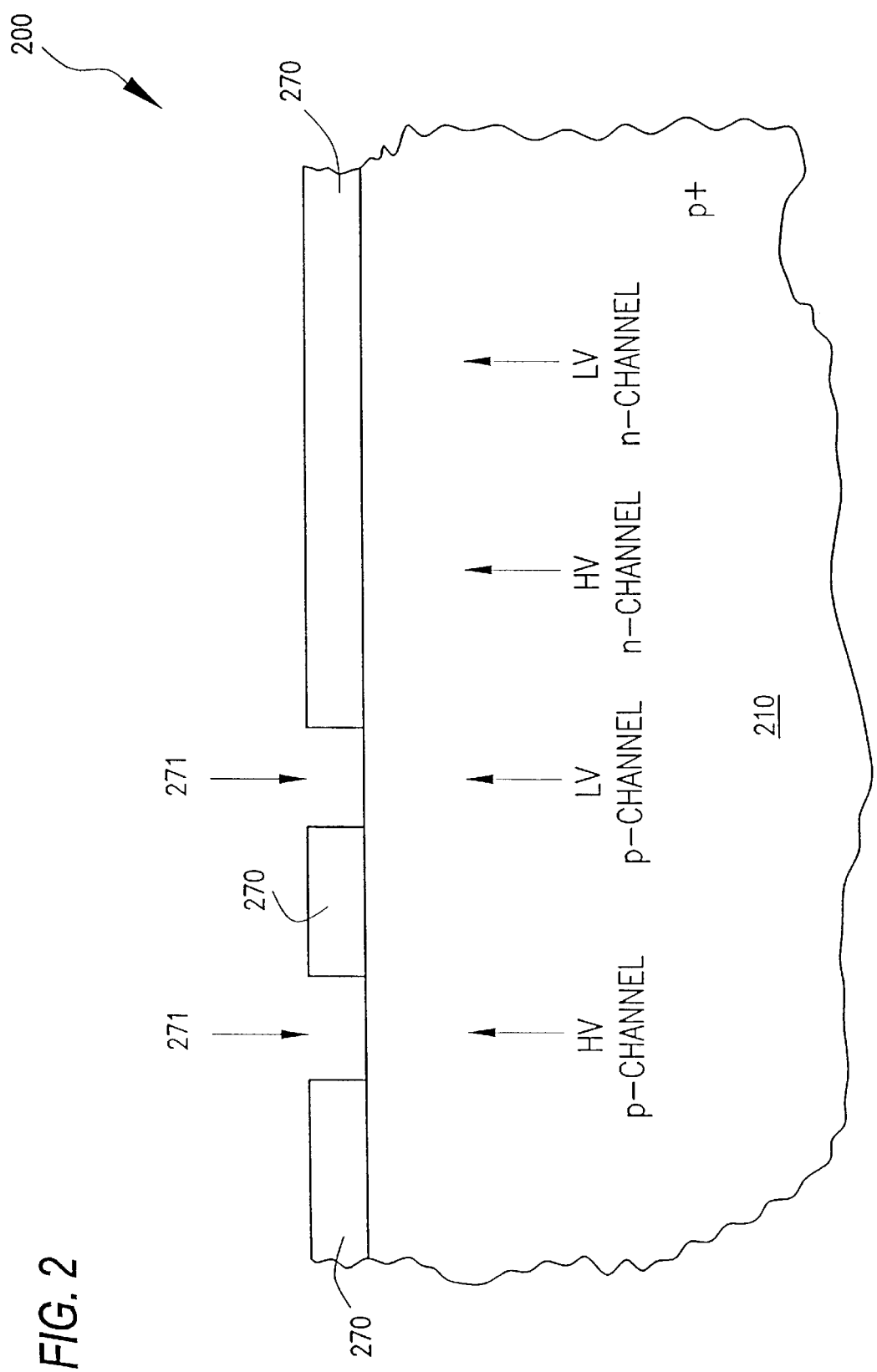
FIG. 2 is a cross-sectional diagram of a portion of a prior art integrated circuit having high and low voltage diffusion wells at an early stage of fabrication.
Figure 3:
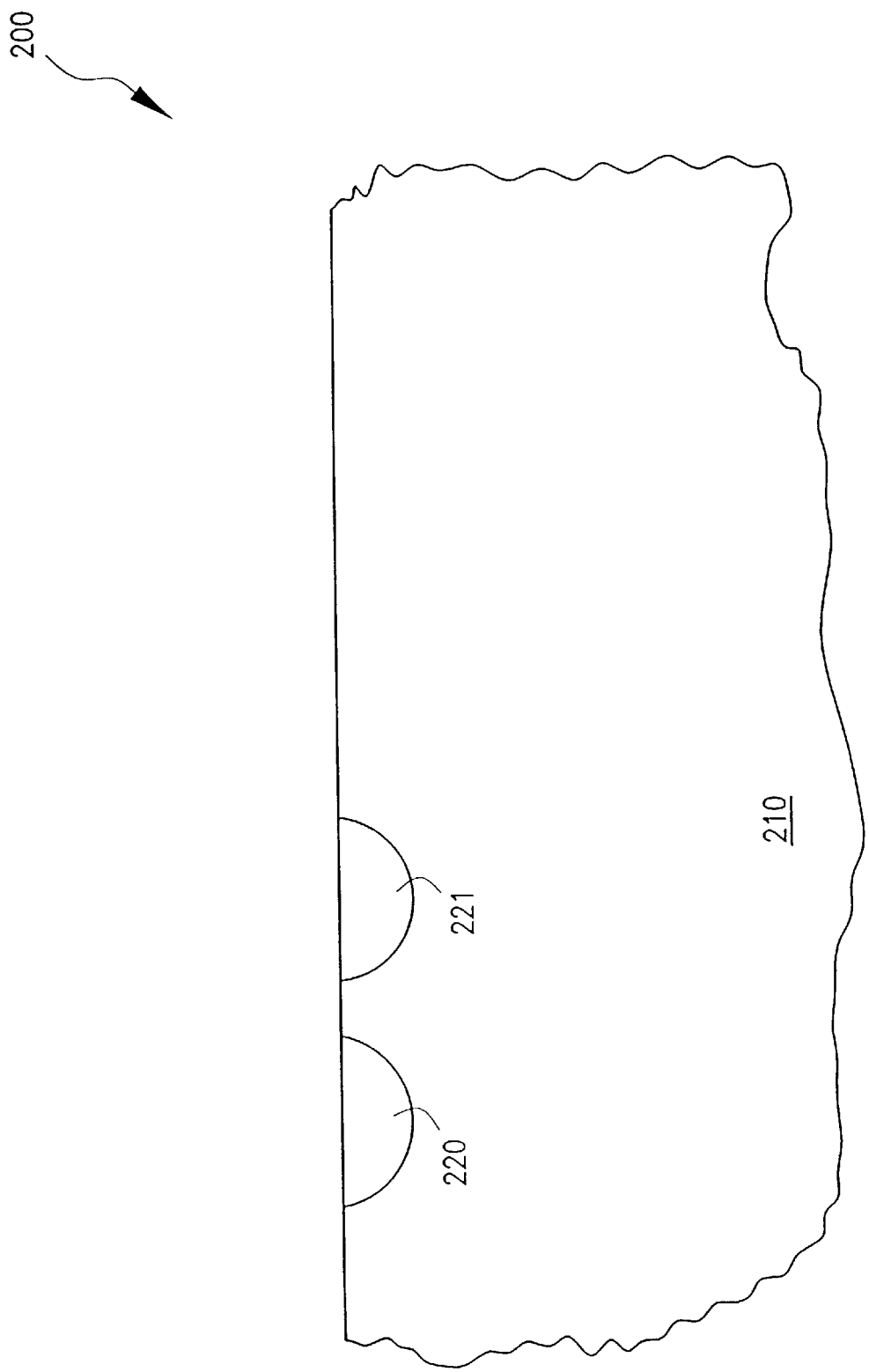
FIG. 3 is a cross-sectional diagram of the integrated circuit portion of FIG. 2 at a later stage of fabrication.

FIG. 2 illustrates a portion 200 of an integrated circuit on which four devices will be fabricated at the indicated places: a high voltage p-channel transistor, a low voltage p-channel transistor, a high voltage n-channel transistor and a low voltage n-channel transistor. A photoresist mask 270 with two diffusion well openings 271 is formed on substrate 210. The well openings 271 are of equal size. Low energy (less than approximately 200 keV) ion implantation occurs in the well openings 271. The entire integrated circuit is then heated to cause the implants to diffuse both vertically and horizontally. The resultant diffusion n-wells 220, 221 are shown in FIG. 3 which also shows removal of the mask 270. It should be noted that the n-wells 220, 221 are wider than were the well openings 271 in the mask 270 of FIG. 2. This is because, as discussed above, diffusion occurs horizontally as well as vertically.

Figure 4:
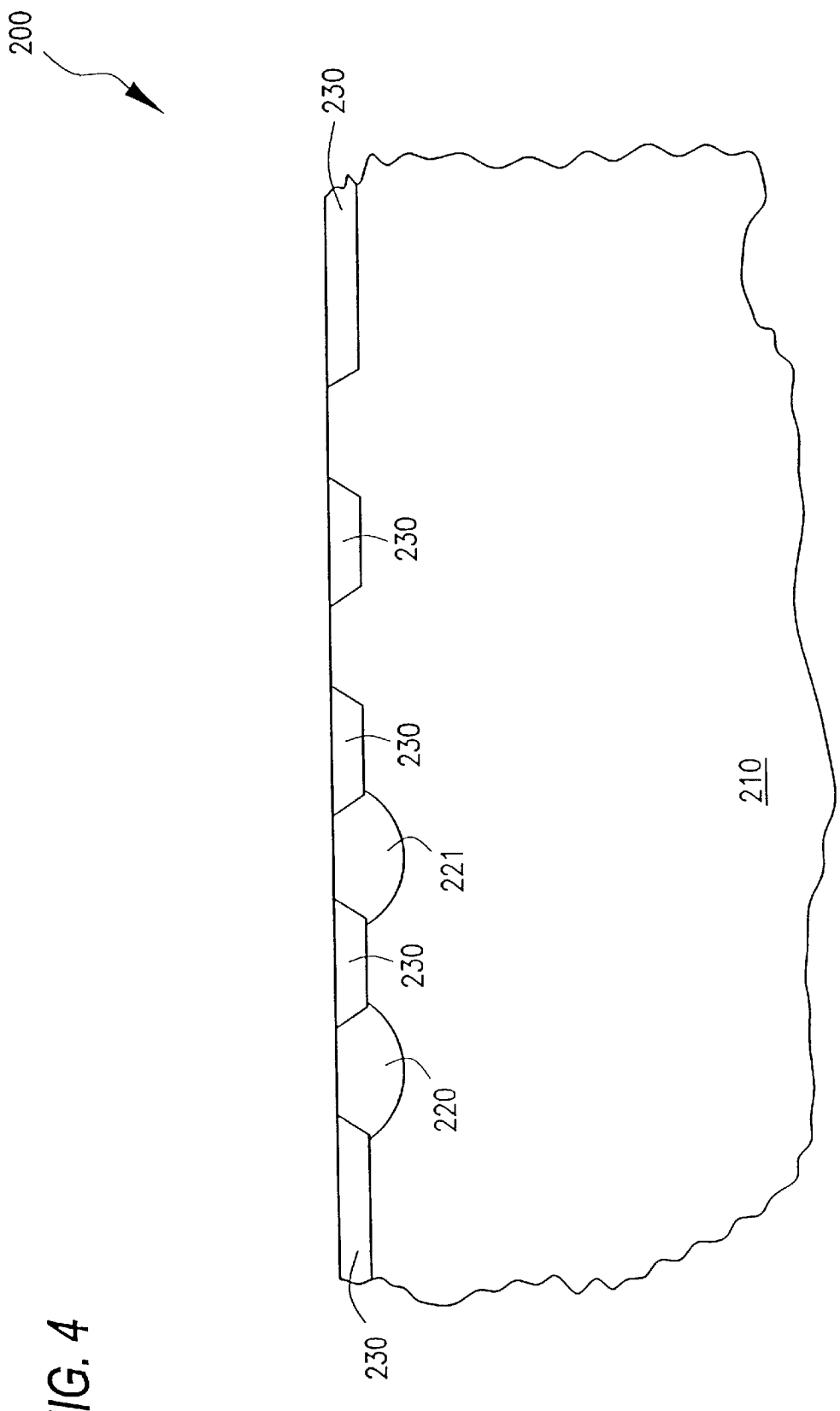
FIG. 4 is a cross-sectional diagram of the integrated circuit portion of FIG. 3 at a later stage of fabrication.
Figure 5:
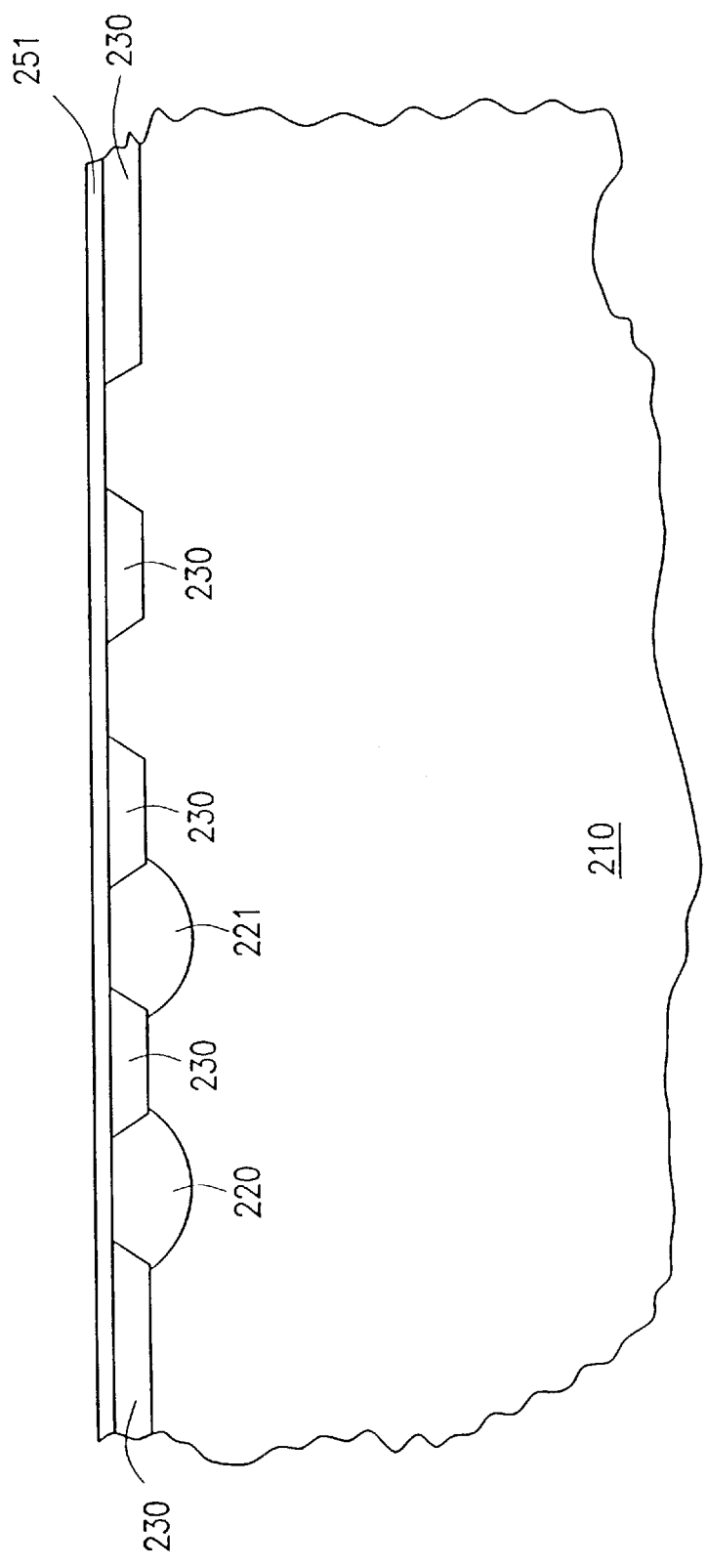
FIG. 5 a cross-sectional diagram of the integrated circuit portion of FIG. 4 at a later stage of fabrication.

Next, as shown in FIG. 4, field oxide areas 230 are formed by a process such as STI (shallow trench isolation). A thin oxide layer 251 is then grown over the entire wafer 210 as shown in FIG. 5. The oxide layer 251 is typically thermally grown. The oxide layer is formed such that its thickness is less than the required gate oxide thickness for the high voltage devices by approximately the thickness of the gate oxide required for low voltage devices.

Figure 6:
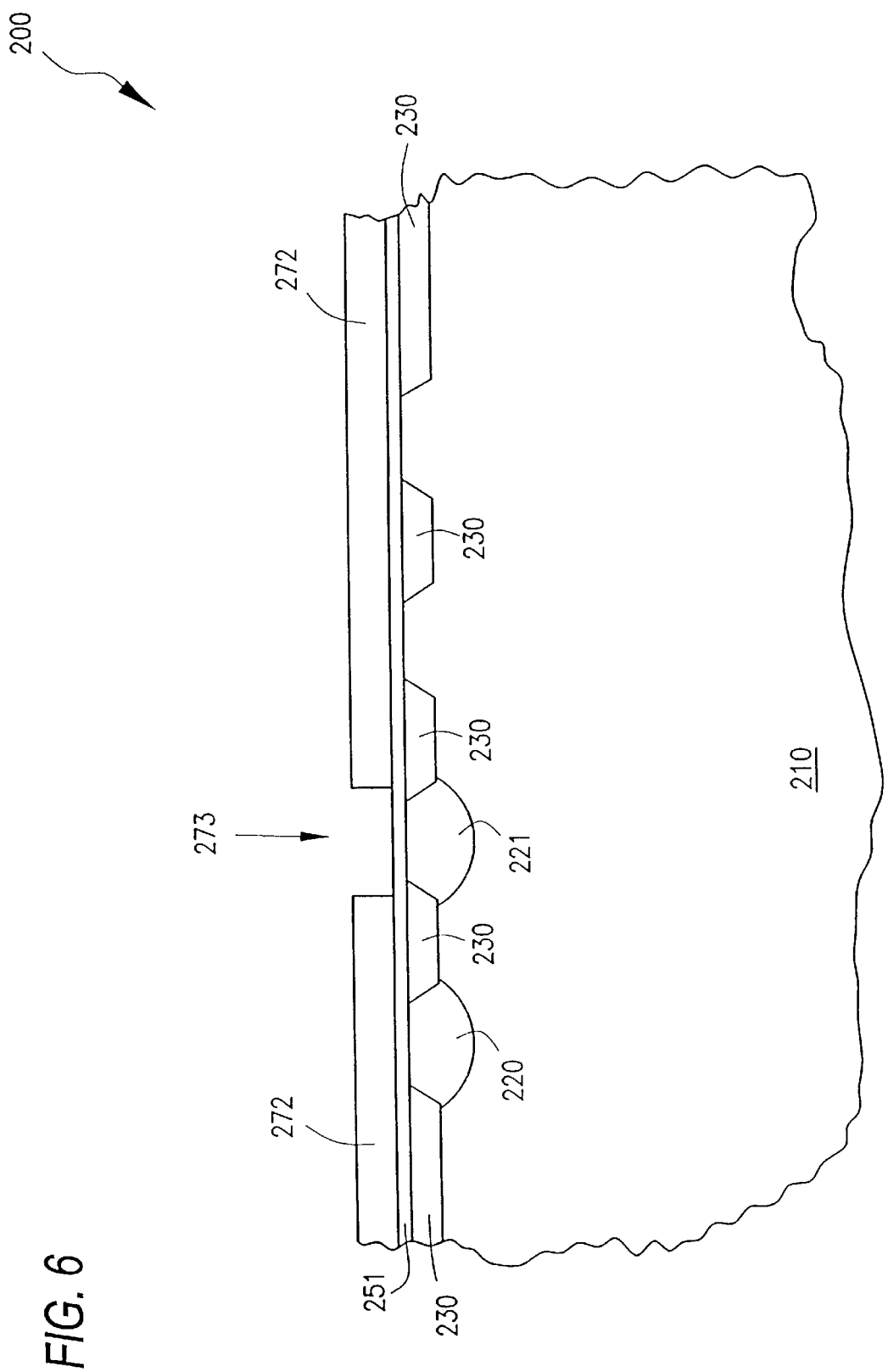
FIG. 6 is a cross-sectional diagram of the integrated circuit portion of FIG. 5 at a later stage of fabrication.

Next, a second photoresist mask 272 is formed with openings 273 over only the low voltage n-wells 221 as shown in FIG. 6. Then the low voltage n-wells are doped to adjust the threshold voltage of a transistor to be formed later in the n-well 221. It should be noted that the low voltage n-well 221 will be further doped to its final value in a subsequent step as discussed below. Because the subsequent processing involves doping both low voltage devices with p-type material such that the n-channel low voltage device threshold is appropriately set, the doping that occurs through openings 273 at this point involves doping the n-well 221 with a concentration of n-type material higher than that which would be required to properly set the threshold if no subsequent doping were to occur. The excess positive doping is offset by the subsequent negative doping in the steps below. The mask 272 is then removed.

Figure 7:
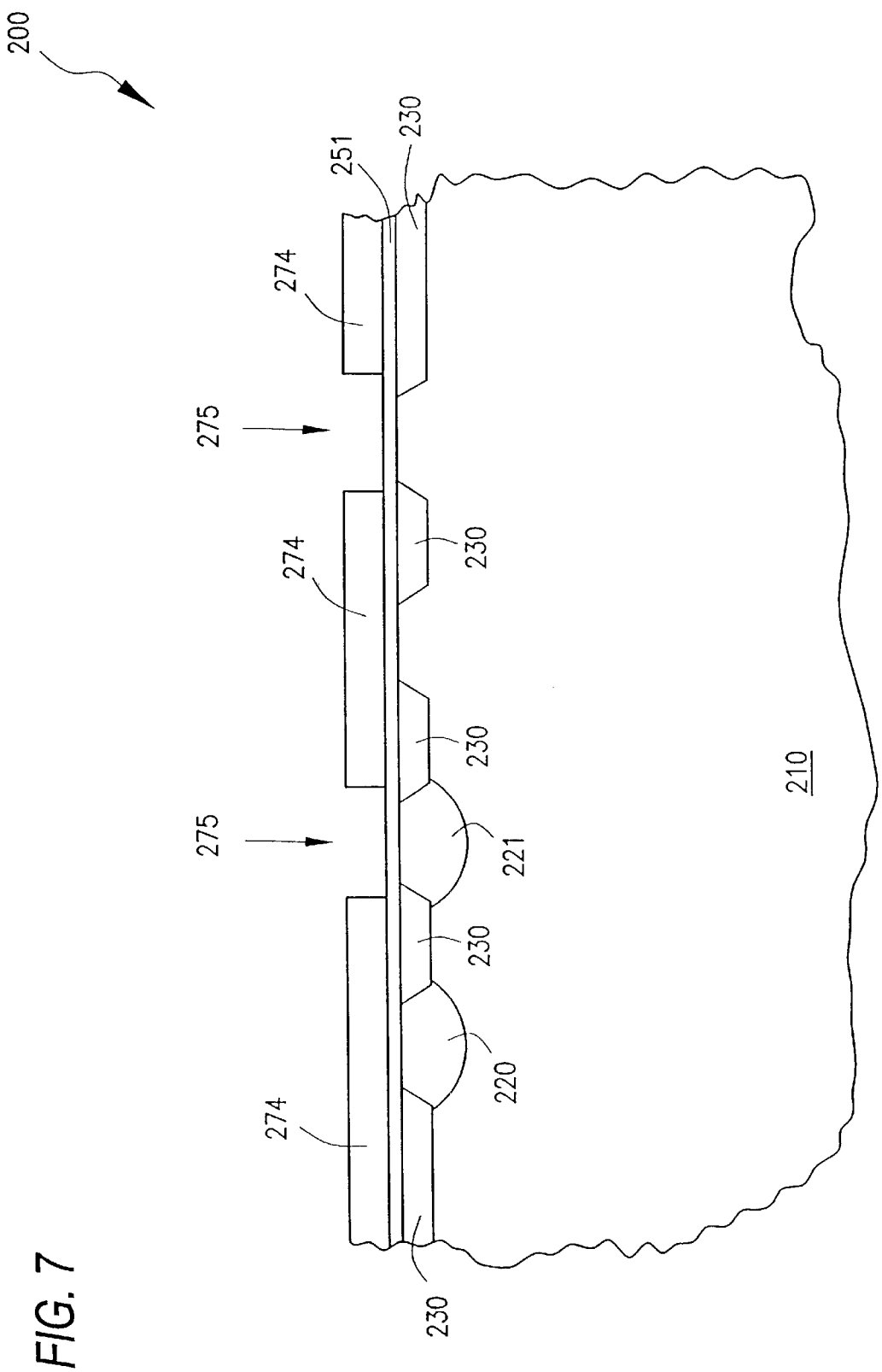
FIG. 7 is a cross-sectional diagram of the integrated circuit portion of FIG. 6 at a later stage of fabrication.
Figure 8:
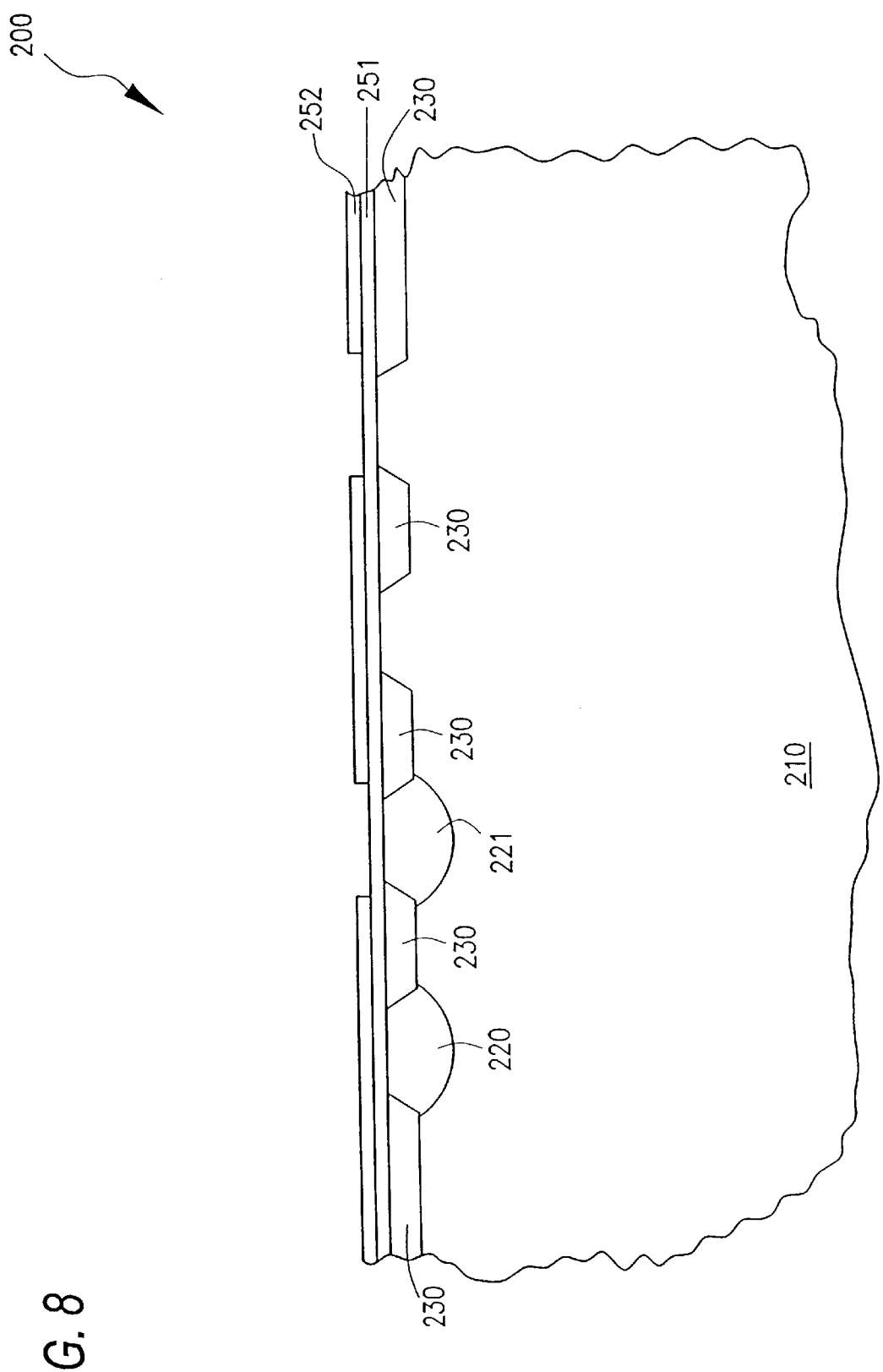
FIG. 8 is a cross-sectional diagram of the integrated circuit portion of FIG. 7 at a later stage of fabrication.

Then a photoresist mask 274 is formed with openings 275 over the future locations of all low voltage devices, including both the n-type and p-type low voltage devices as shown in FIG. 7. The oxide in the openings 275, which correspond to the low voltage devices, is then removed. Then, both the n-channel and p-channel low voltage devices are doped to their final values through the mask openings 275. Then the mask 274 is removed. Additional gate oxide is then grown over the entire wafer such that the total thickness of the gate oxide over the high voltages areas is approximately equal to the required gate oxide for high voltage devices and the gate oxide thickness over the low voltage areas is approximately equal to the required gate oxide for low voltage devices. The resultant structure, with thin gate oxide 251 over the low voltage areas and thick gate oxide 252 over the high voltage areas, is shown in FIG. 8. The process of forming oxides of different thickness over the high and low voltage devices is called gate oxide differentiation. Processing steps after gate oxide differentiation, which involves forming gate stacks, passivation layers, interconnection layers, and other subsequent processing steps, depending upon the specific application, are conventional and will not be discussed in further detail herein.

The processing illustrated above in FIGS. 1–8 is simple in that it requires three masks to complete processing up to gate oxide differentiation. However, because this processing uses a diffusion well for both high and low voltage devices, the low voltage devices are not as tightly packed as would be possible if retrograde wells were used for the low voltage devices. Next, one possible process conceived by the inventor for fabricating an integrated circuit with both retrograde and diffusion wells and both n-type and p-type high and low voltage devices will be illustrated.

Figure 9:
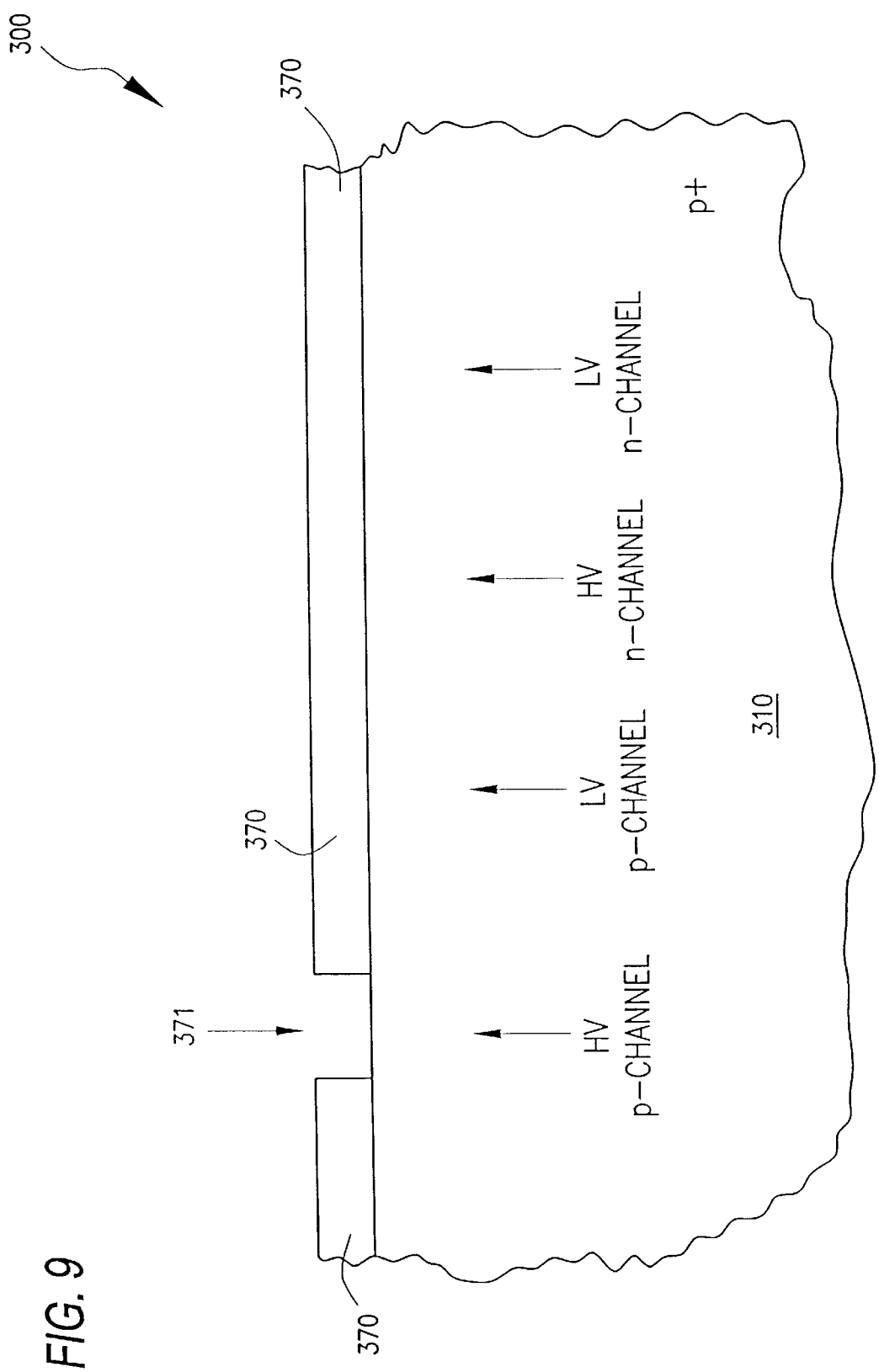
FIG. 9 is a cross sectional diagram of a portion of an integrated circuit having a high voltage diffusion well and a low voltage retrograde well at an early stage of fabrication in a fabrication process according to one embodiment of the present invention.

FIG. 9 is a cross-sectional view of a portion 300 of a substrate 310 on which four devices will be fabricated at the indicated places: a high voltage p-channel transistor, a low voltage p-channel transistor, a high voltage n-channel transistor and a low voltage n-channel transistor. A diffusion well will be formed for the high voltage p-channel transistor and a retrograde well will be formed for the low voltage p-channel transistor. Processing begins by forming a mask 370 with an opening 371 corresponding to the desired location of the diffusion well for the high voltage device on the substrate 310 as shown in FIG. 9.

Figure 10:
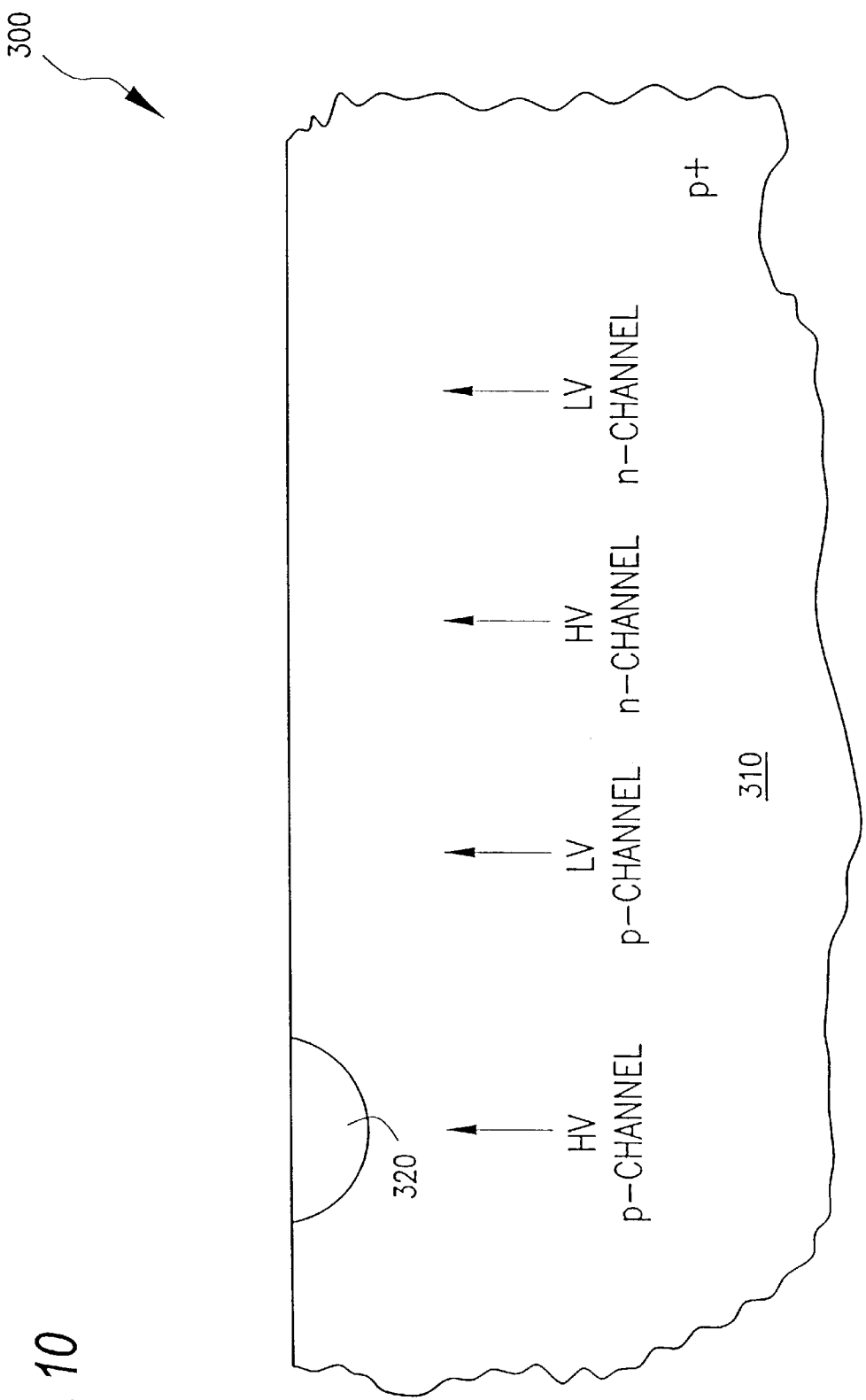
FIG. 10 is a cross-sectional diagram of the integrated circuit portion of FIG. 9 at a later stage of fabrication.
Figure 11:
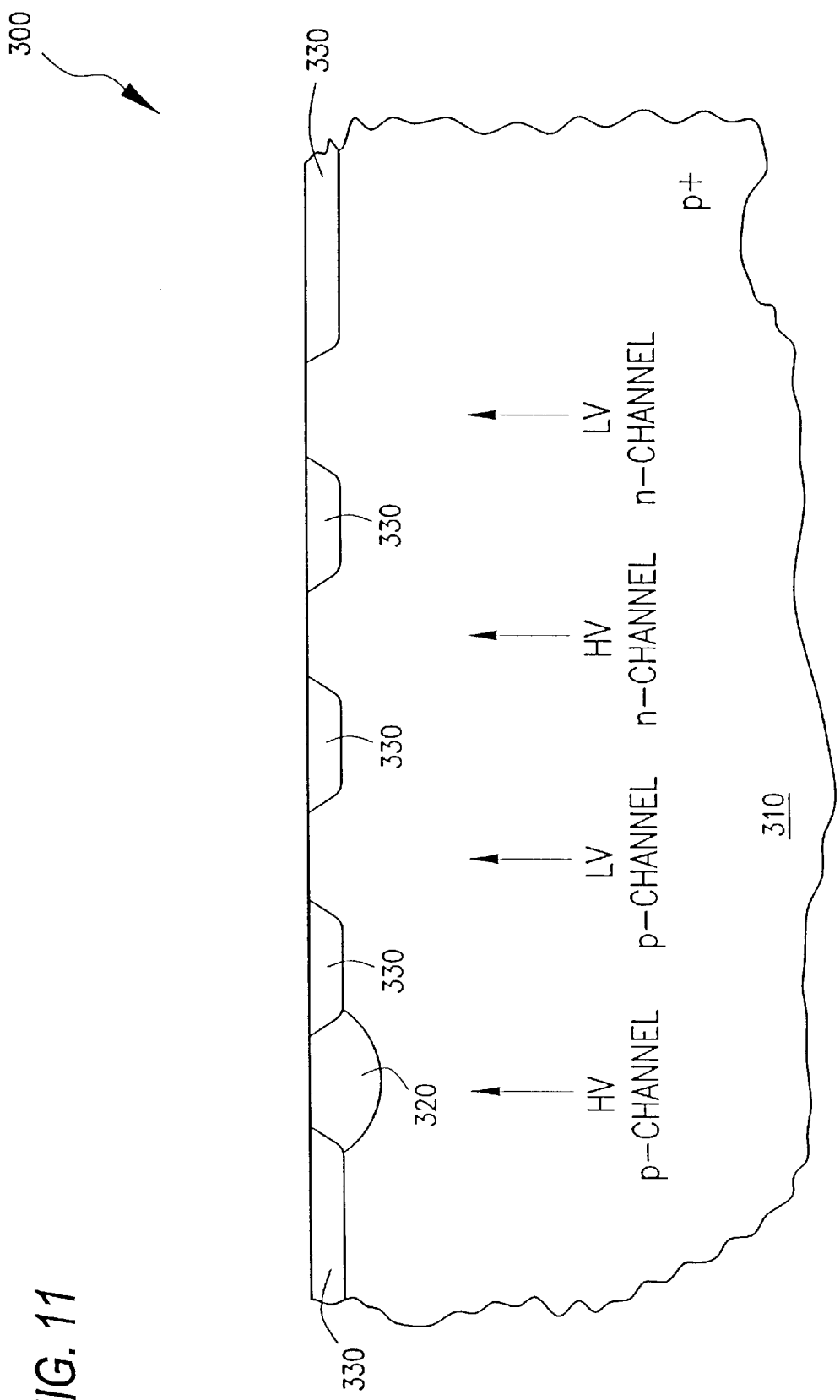
FIG. 11 is a cross-sectional diagram of the integrated circuit portion of FIG. 10 at a later stage of fabrication.

After the mask 370 is formed, low energy ion implantation through the mask opening 371 is performed. The wafer 300 is then heated such that the implanted ions diffuse to form the diffusion n-well 320 shown in FIG. 10. Shallow trench isolation regions 330 are then formed using a conventional process as shown in FIG. 11. The shallow trench isolation (STI) process requires some thermal treatment; therefore, it is performed before retrograde wells are formed so that the thermal treatment used in the STI process does not adversely affect retrograde wells formed later.

Figure 12:
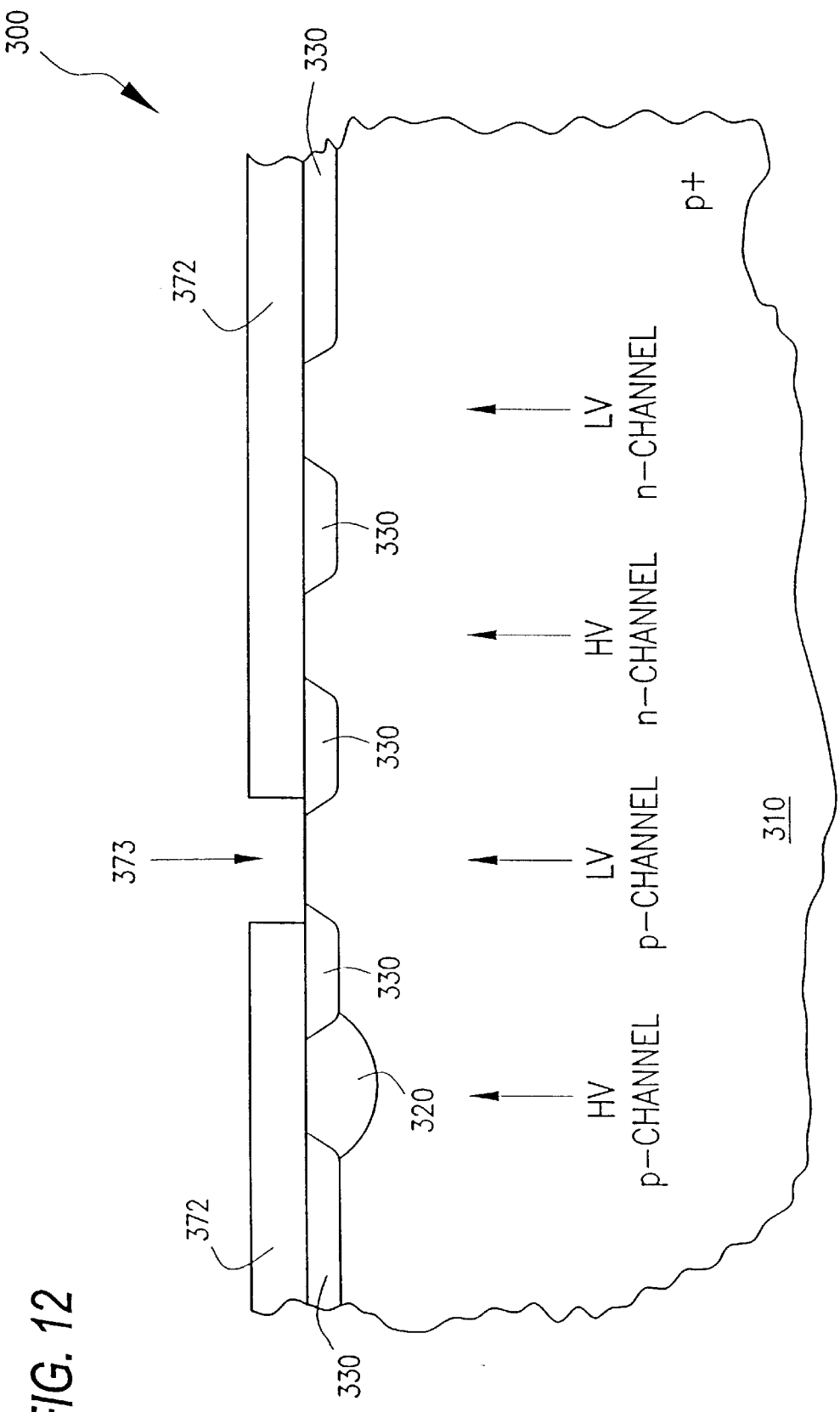
FIG. 12 a cross-sectional diagram of the integrated circuit portion of FIG. 11 at later stage of fabrication.
Figure 13:
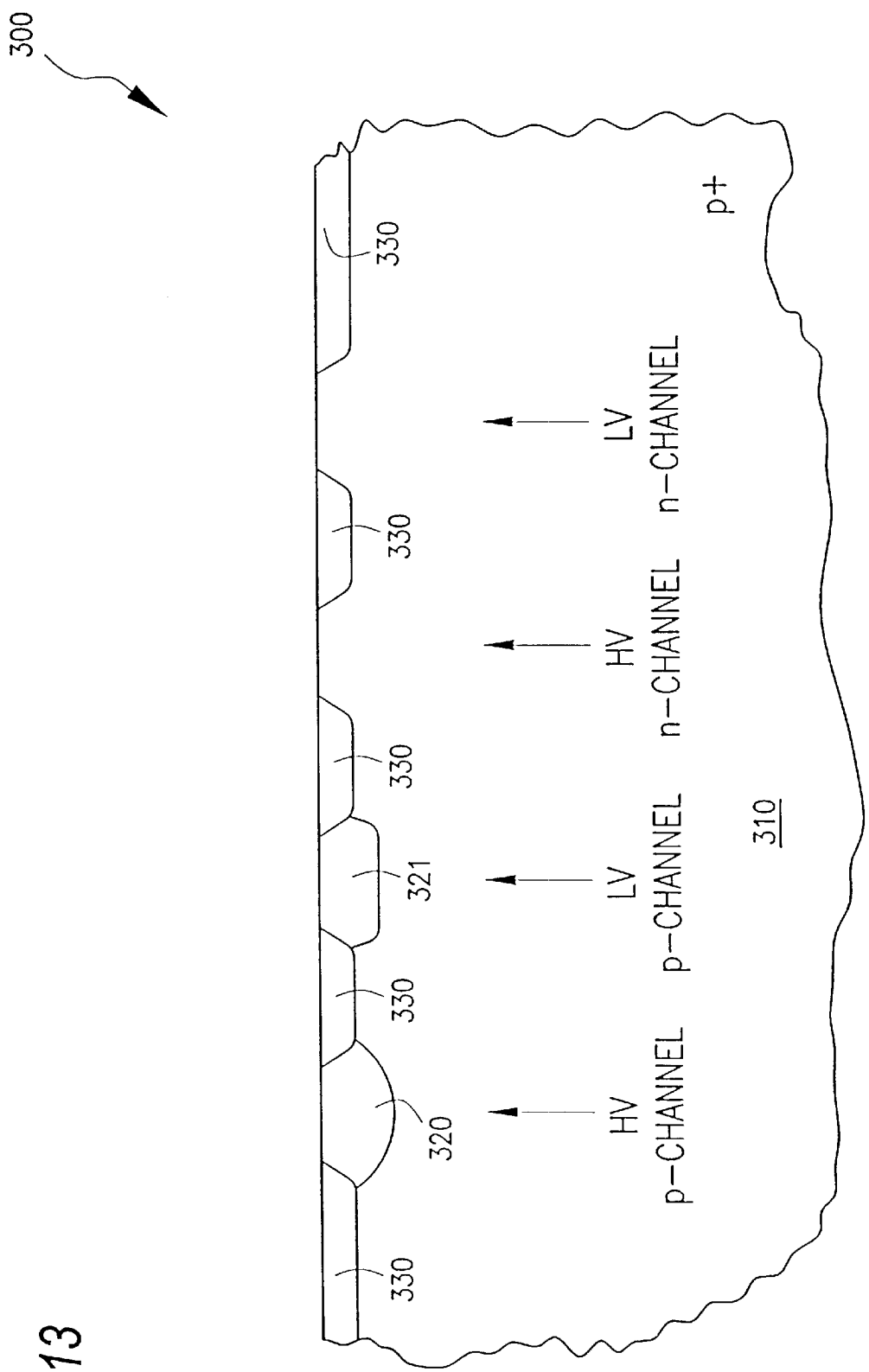
FIG. 13 is a cross-sectional diagram of the integrated circuit portion of FIG. 12 at a later stage of fabrication.
Figure 14:
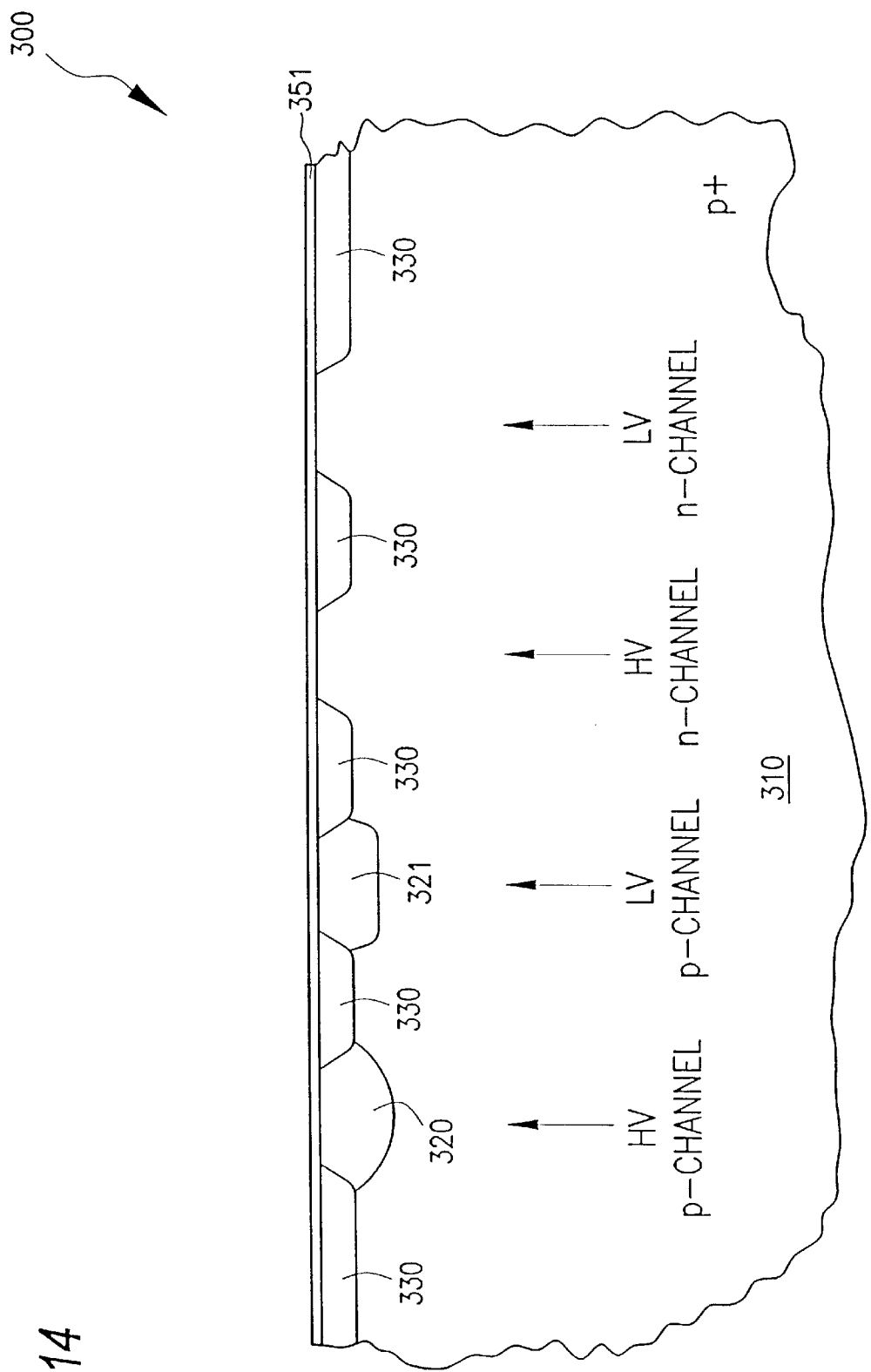
FIG. 14 is a cross-sectional diagram of the integrated circuit portion of FIG. 13 at a later stage of fabrication.

After the isolation regions 330 are formed, a second mask 372 is formed over the substrate 310 as shown in FIG. 12. The mask 372 has an opening 373 to allow high energy (approximately 200 keV to approximately 1 MeV) ion implantation into the substrate 310 to form the retrograde well 321 shown in FIG. 13. The retrograde well 321 is typically more shallow and narrow than the diffusion well 320. A gate oxide layer 351 is then grown over the entire substrate 310 as shown in FIG. 14.

Figure 15:
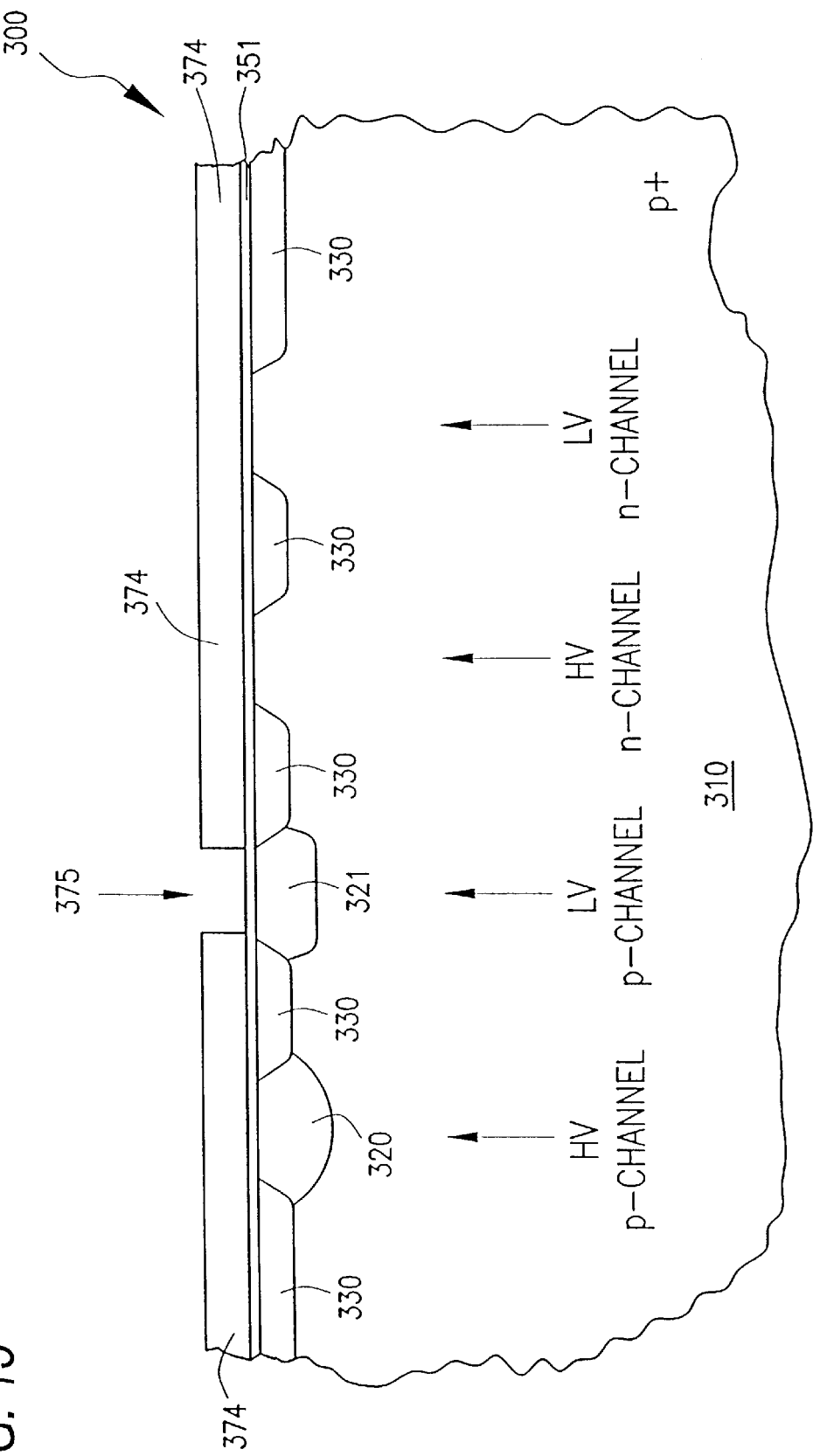
FIG. 15 is a cross-sectional diagram of the integrated circuit portion of FIG. 14 at a later stage of fabrication.

The retrograde well 321 must be "excessively" doped with n-type material as discussed above in connection with FIG. 6. To accomplish this, a third mask 374 with an opening 375 corresponding to the retrograde well 321 is formed over the substrate 310 as shown in FIG. 15. Excessive doping occurs through the opening 375. The mask 374 is then removed.

Figure 16:
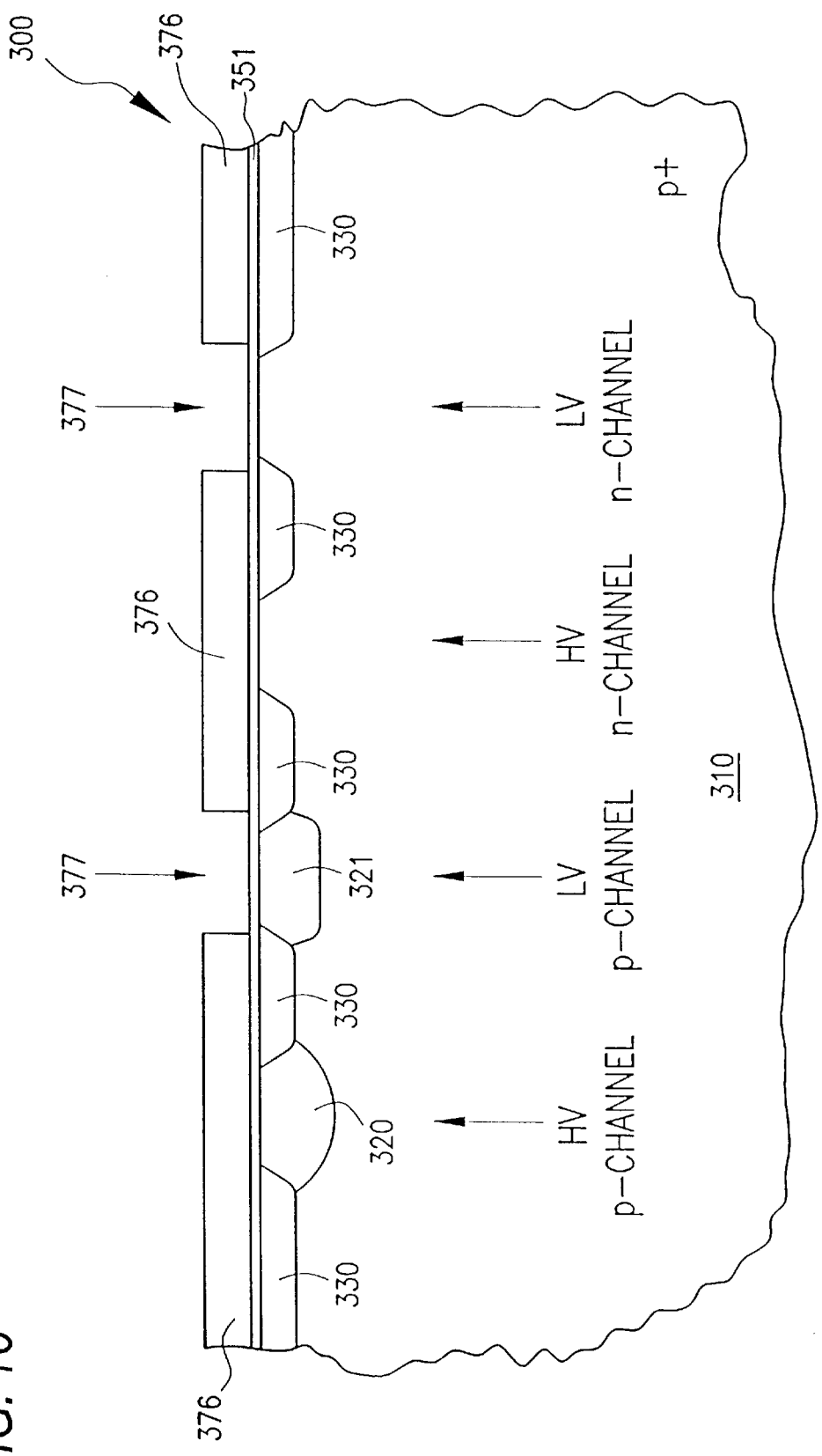
FIG. 16 is a cross-sectional diagram of the integrated circuit portion of FIG. 15 at a later stage of fabrication.
Figure 17:
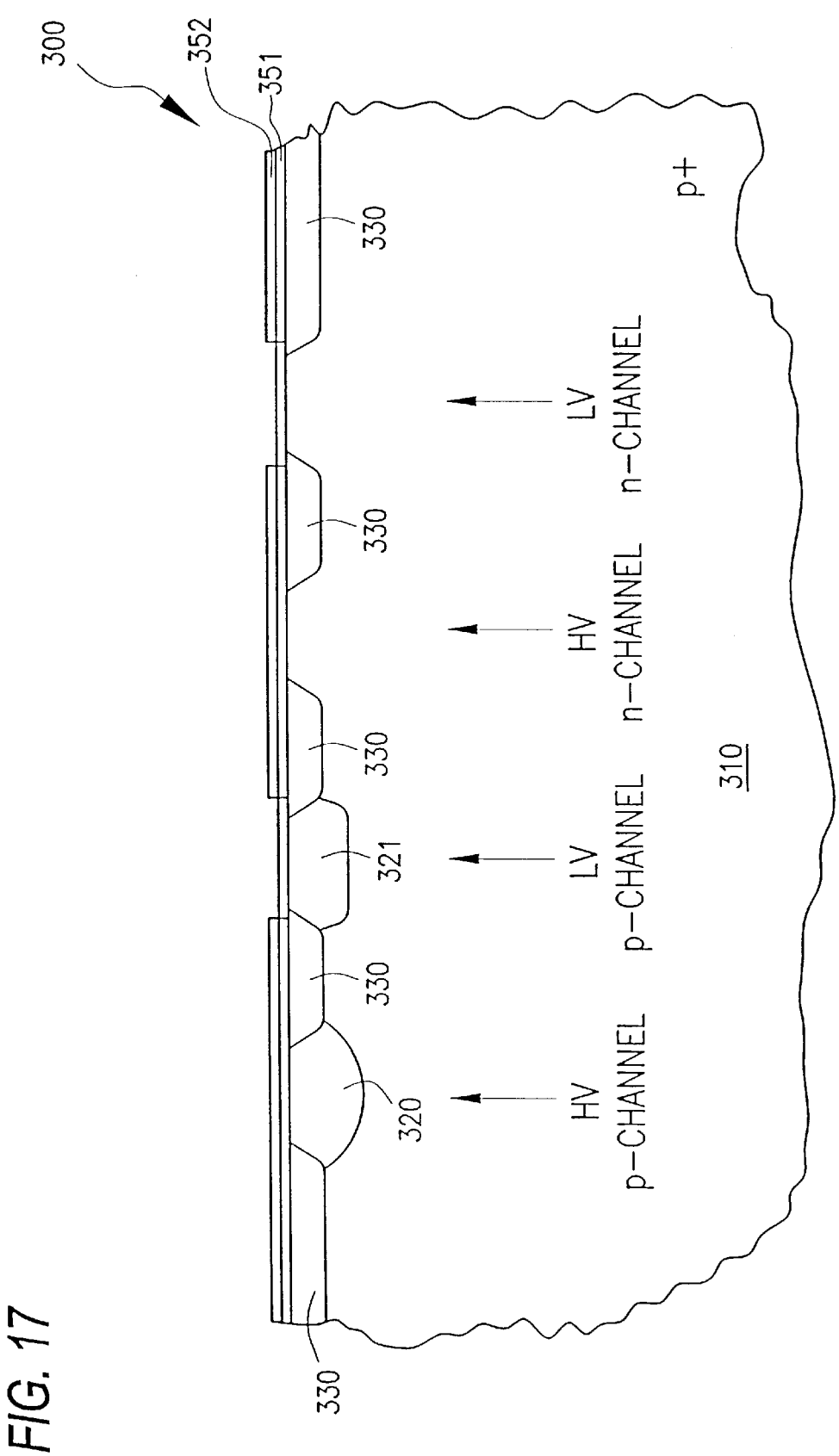
FIG. 17 is a cross-sectional diagram of the integrated circuit portion of FIG. 16 at a later stage of fabrication.

Next, a fourth mask 376 is formed over the substrate 310 with mask openings 377 over both the n-channel and p-channel low voltage transistor locations as shown in FIG. 16. Both the n-channel and p-channel low voltage devices are doped to their final values through the mask openings 377. The gate oxide 351 is then stripped in the areas corresponding to the mask openings 377. Then the mask 376 is removed. Next, an additional oxide layer 352 is grown over the entire substrate 310 as shown in FIG. 17. The total thickness of the oxide layers 351, 352 over the high voltage device wells is sufficient for high voltage devices, while the thickness of the oxide layer 352 over the low voltage device wells (corresponding to the openings 375) is sufficient for low voltage devices. At this point, processing up to gate oxide differentiation is complete. As discussed above in connection with the single well type fabrication process, subsequent processing is conventional and will not be discussed further herein.

Four masks were used in the foregoing dual well process to complete the gate oxide differentiation step of the fabrication process. In contrast, only three masks were necessary to reach the same point in the single diffusion well process. Next, an improved method in accordance with the present invention for fabricating a dual well structure requiring only three masks to complete the gate oxide differentiation step will be illustrated.

Figure 18:
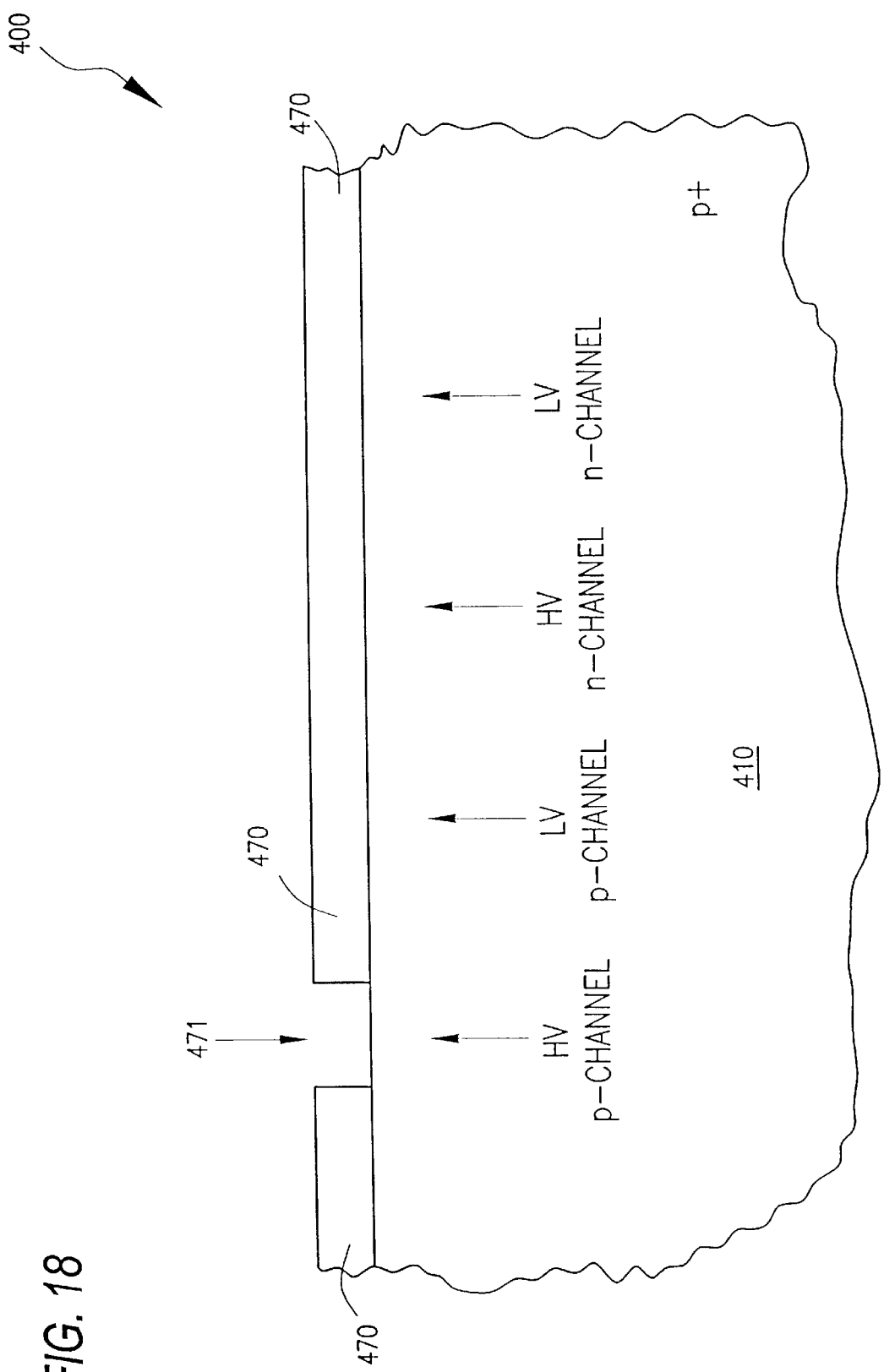
FIG. 18 is a cross sectional diagram of a portion of an integrated circuit at an early stage of fabrication according to another embodiment of the present invention.
Figure 19:
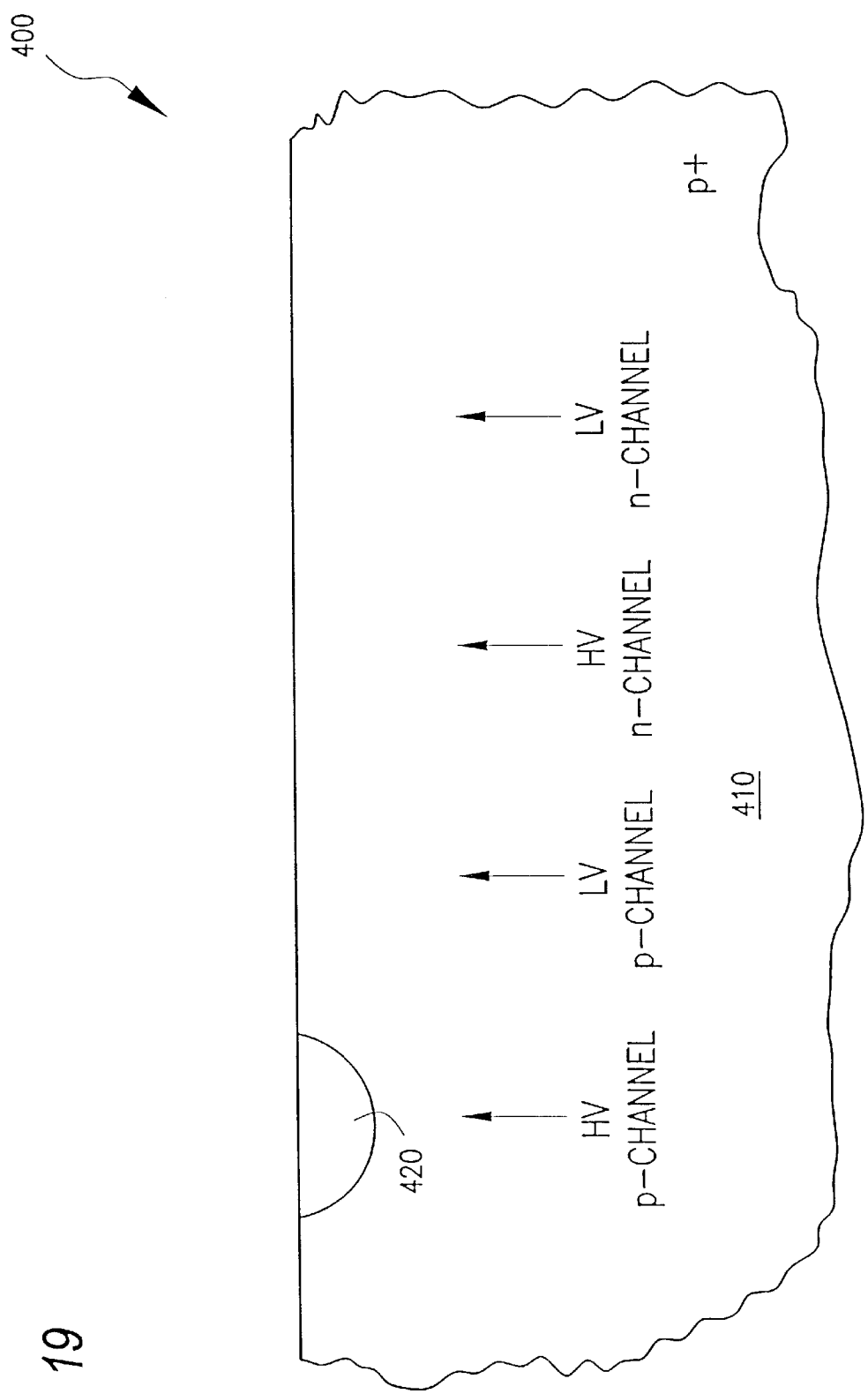
FIG. 19 is a cross sectional diagram of the integrated circuit portion of FIG. 18 at a later stage of fabrication.
Figure 20:
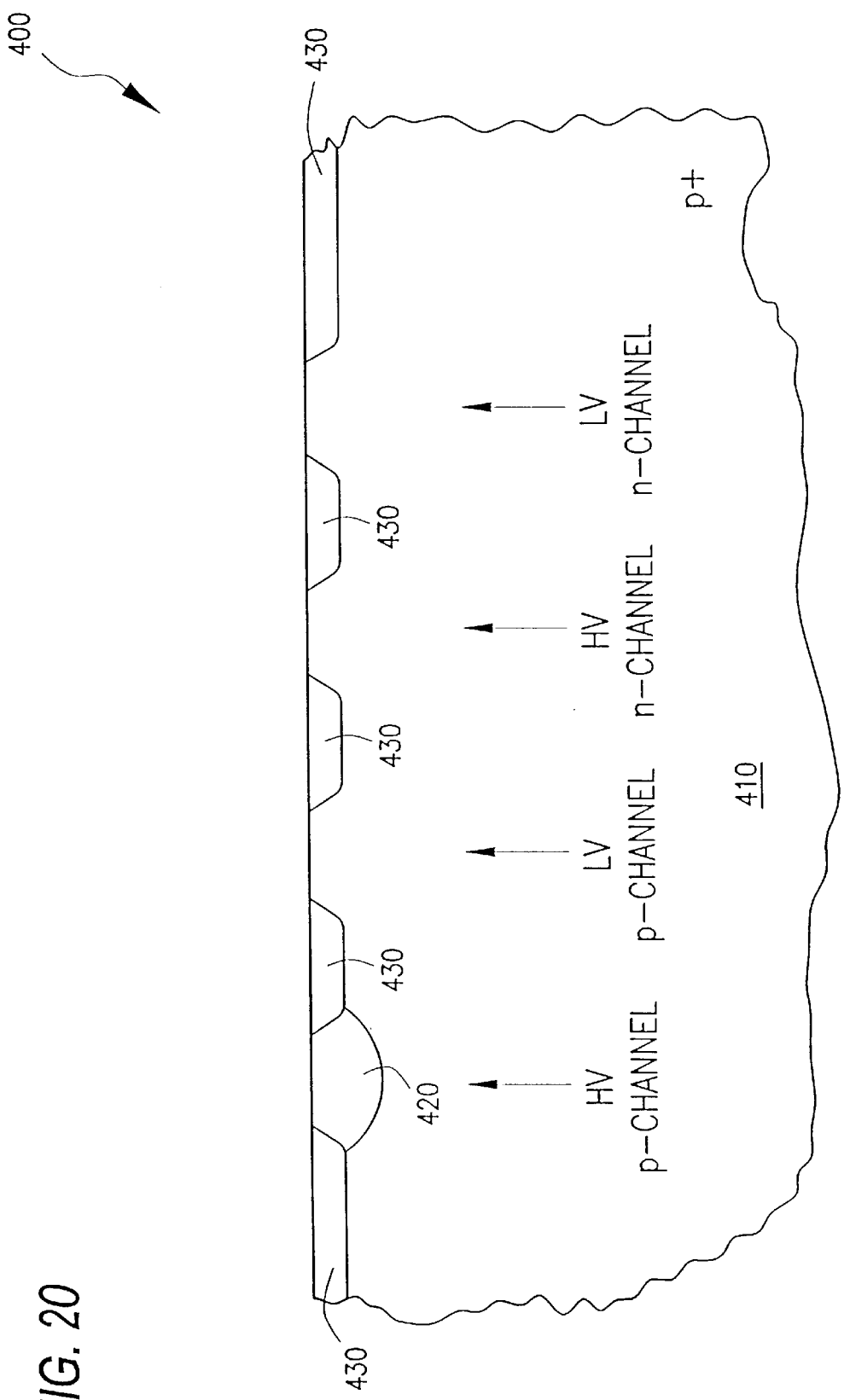
FIG. 20 is a cross sectional diagram of the integrated circuit portion of FIG. 19 at a later stage of fabrication.
Figure 21:
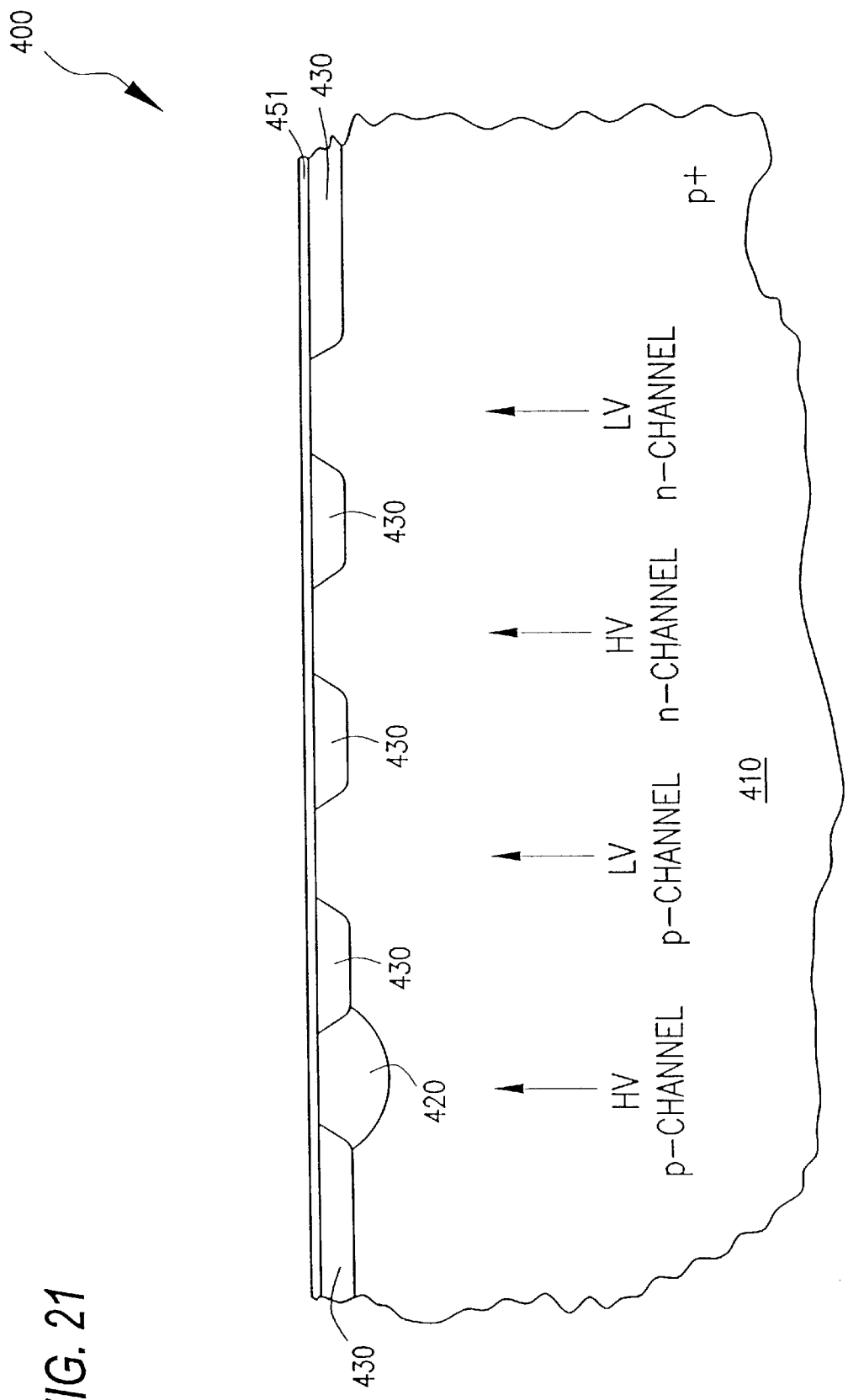
FIG. 21 is a cross sectional diagram of the integrated circuit portion of FIG. 20 at a later stage of fabrication.

Processing for a dual well structure in accordance with the invention is shown starting with FIG. 18. A first mask 470 with an opening 471 for a diffusion well is formed on the substrate 410. Low energy ion implantation occurs through the opening 471 after which the mask is removed and the entire structure 410 is heated to diffuse the implanted ions. The resulting diffusion well 420 is shown in FIG. 19. Isolations regions 430 as shown in FIG. 20 are then formed by an STI process. Next, as shown in FIG. 21, an oxide layer 451 is grown over the substrate 410. Once again, the thickness of the oxide layer 451 is less than the final desired thickness of the gate oxide for high voltage devices.

Figure 22:
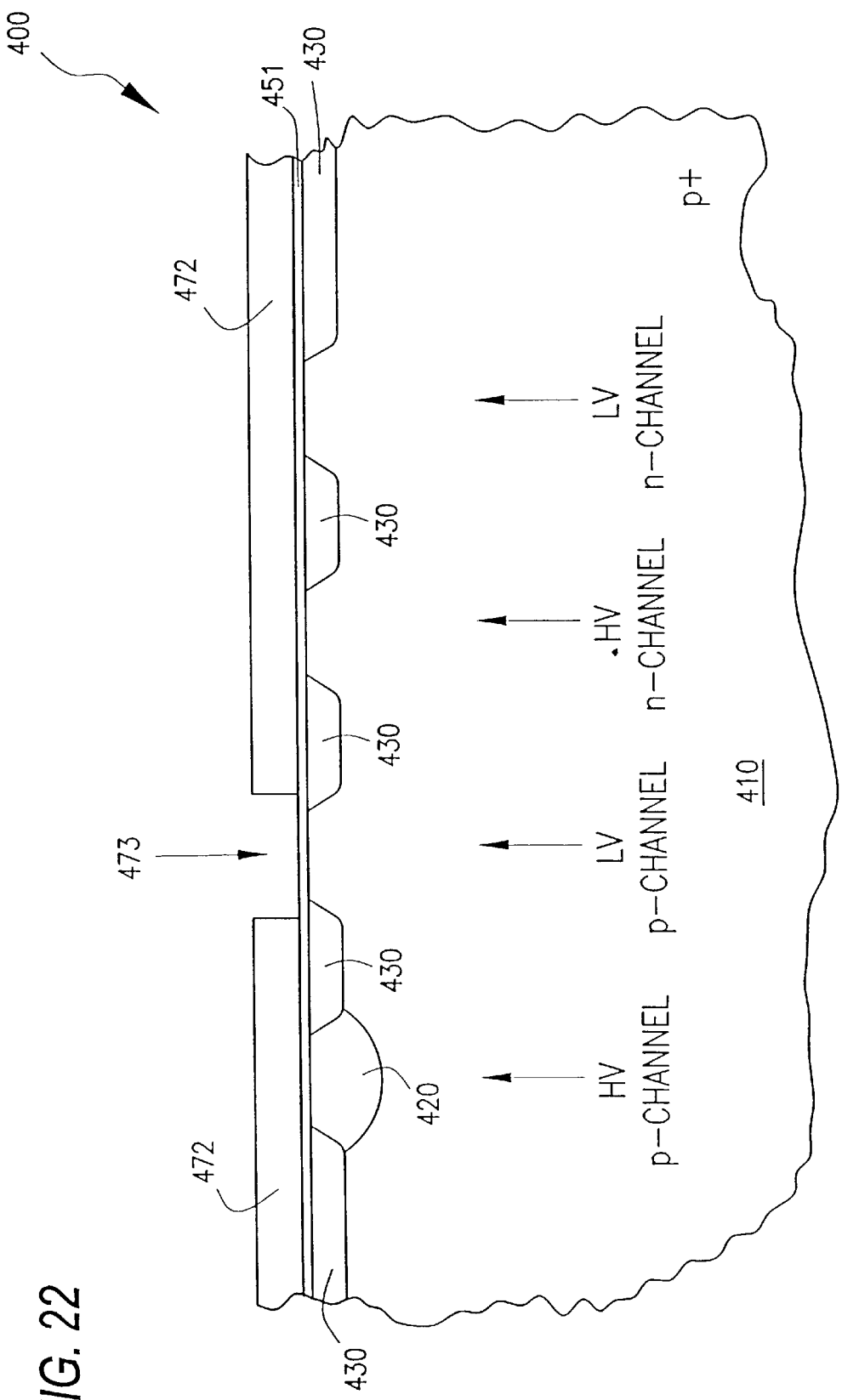
FIG. 22 is a cross sectional diagram of the integrated circuit portion of FIG. 21 at a later stage of fabrication.
Figure 23:
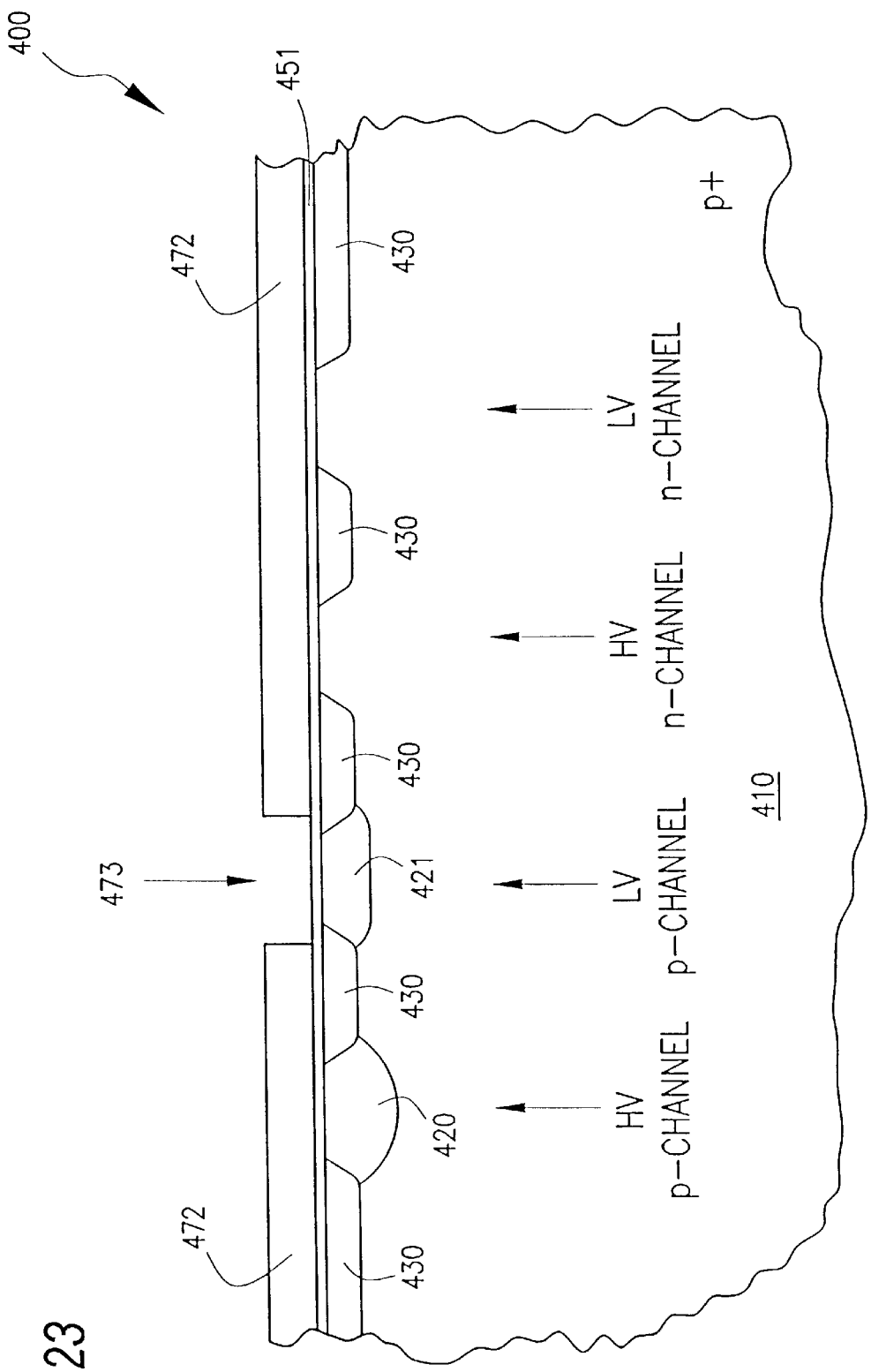
FIG. 23 is a cross sectional diagram of the integrated circuit portion of FIG. 22 at a later stage of fabrication.

Next, a second mask 472 with an opening 473 is provided over the substrate 410 as shown in FIG. 22. High energy ion implantation occurs through the opening 473 to form a retrograde well 421 as shown in FIG. 23. At this point, the processing deviates from the four-mask processing discussed above in connection with FIGS. 9–17.

Figure 24:
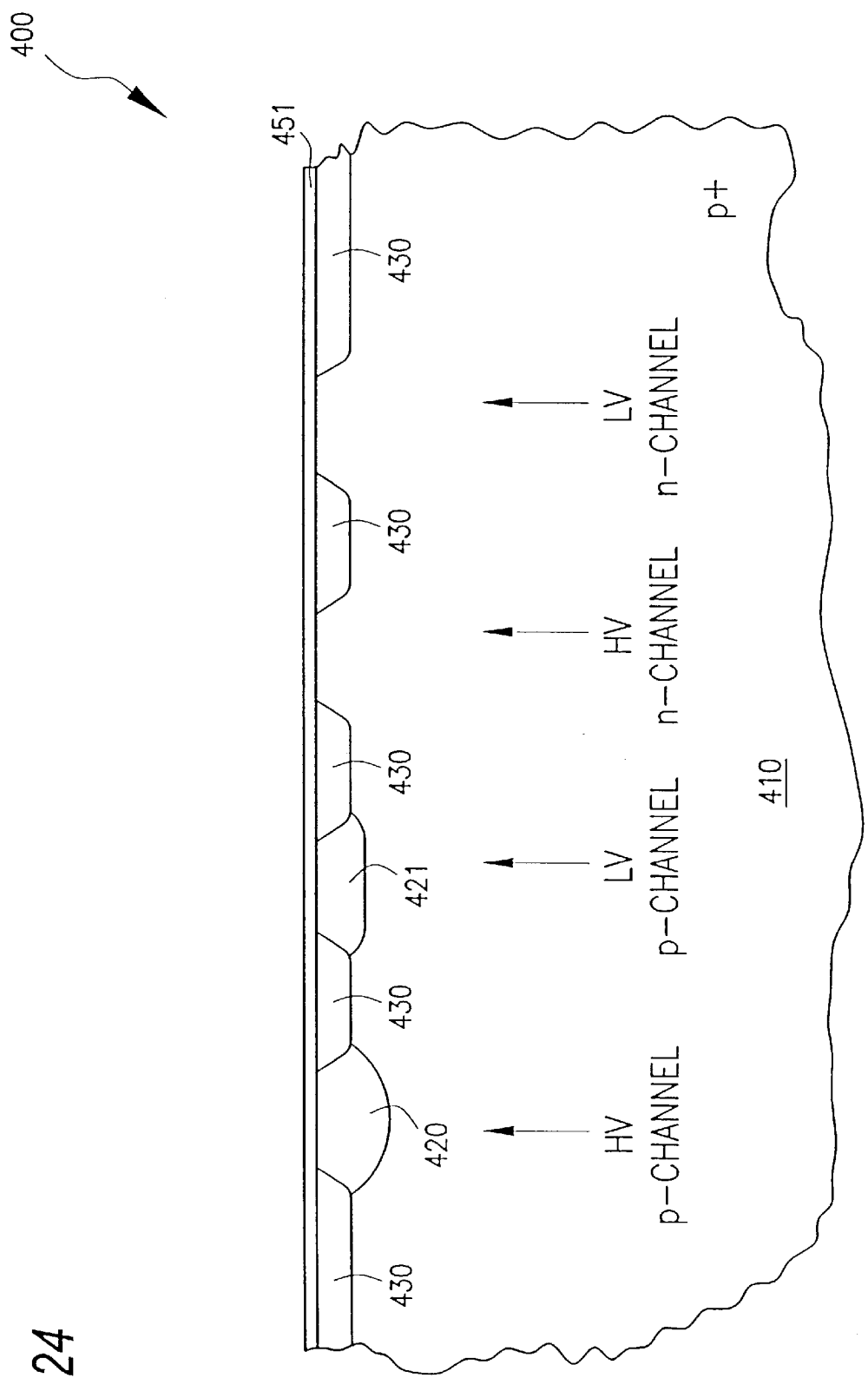
FIG. 24 is a cross sectional diagram of the integrated circuit portion of FIG. 23 at a later stage of fabrication.

After the high energy ion implantation occurs through opening 473 and the retrograde well 421 is formed, the well is doped through the same opening 473. This results in the doping of non-active areas (i.e., source, drain and area under the gate stack) in the retrograde well, but this is acceptable. The doping that occurs at this point results is "excessive," meaning that the well 421 is more positively doped at this point than it will be at the end of processing. Further doping, as discussed below, will set the gate threshold to the proper level. The mask 472 is removed after the retrograde well has been initially doped as shown in FIG. 24.

Figure 25:
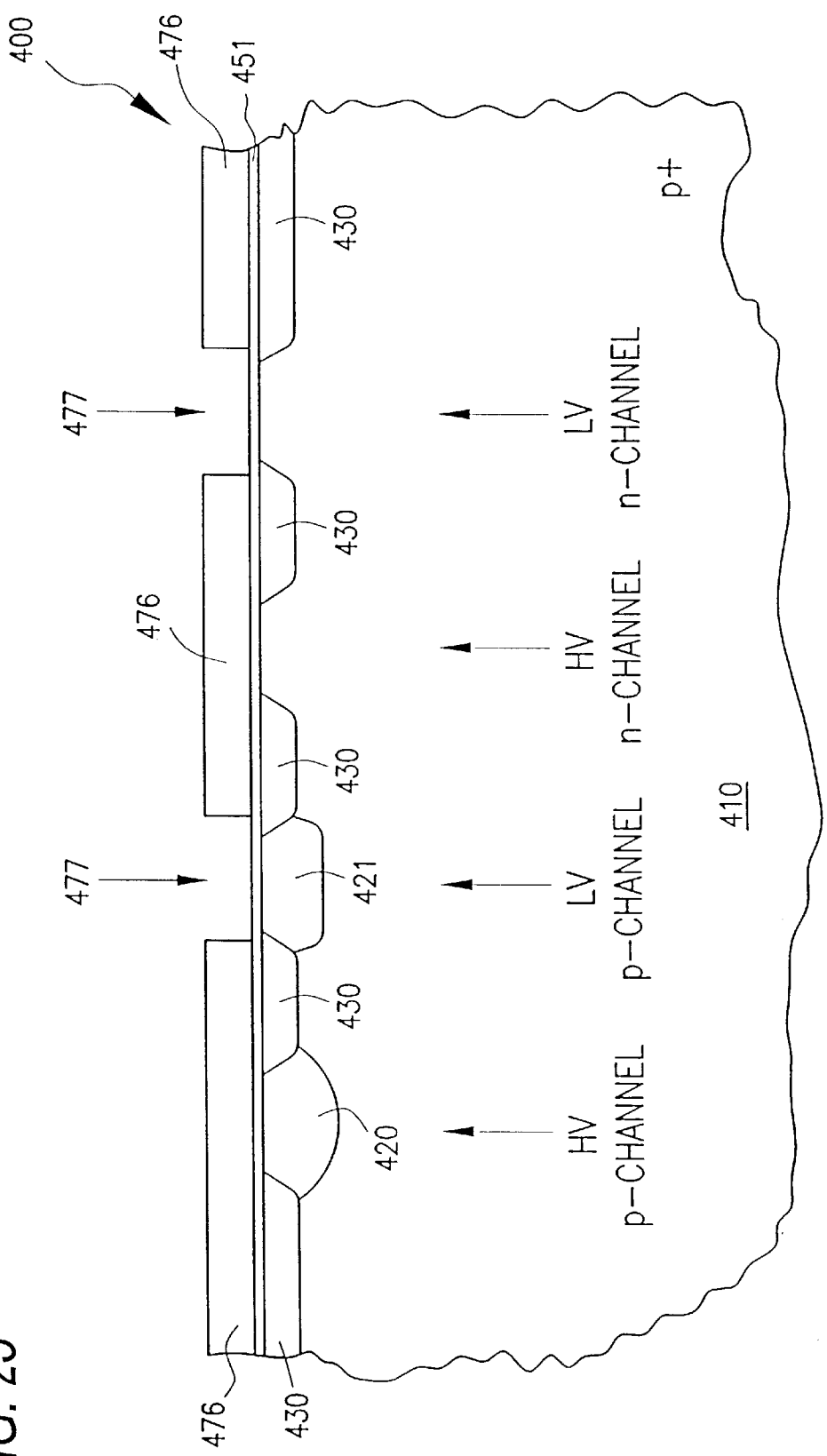
FIG. 25 is a cross sectional diagram of the integrated circuit portion of FIG. 24 at a later stage of fabrication.

After the mask 472 is removed, a third mask 476 with openings 477 over both the n-channel and p-channel low voltage device locations is formed over the substrate 410 as shown in FIG. 25. The gate oxide layer 451 is stripped in areas exposed by the openings 477.

Figure 26:
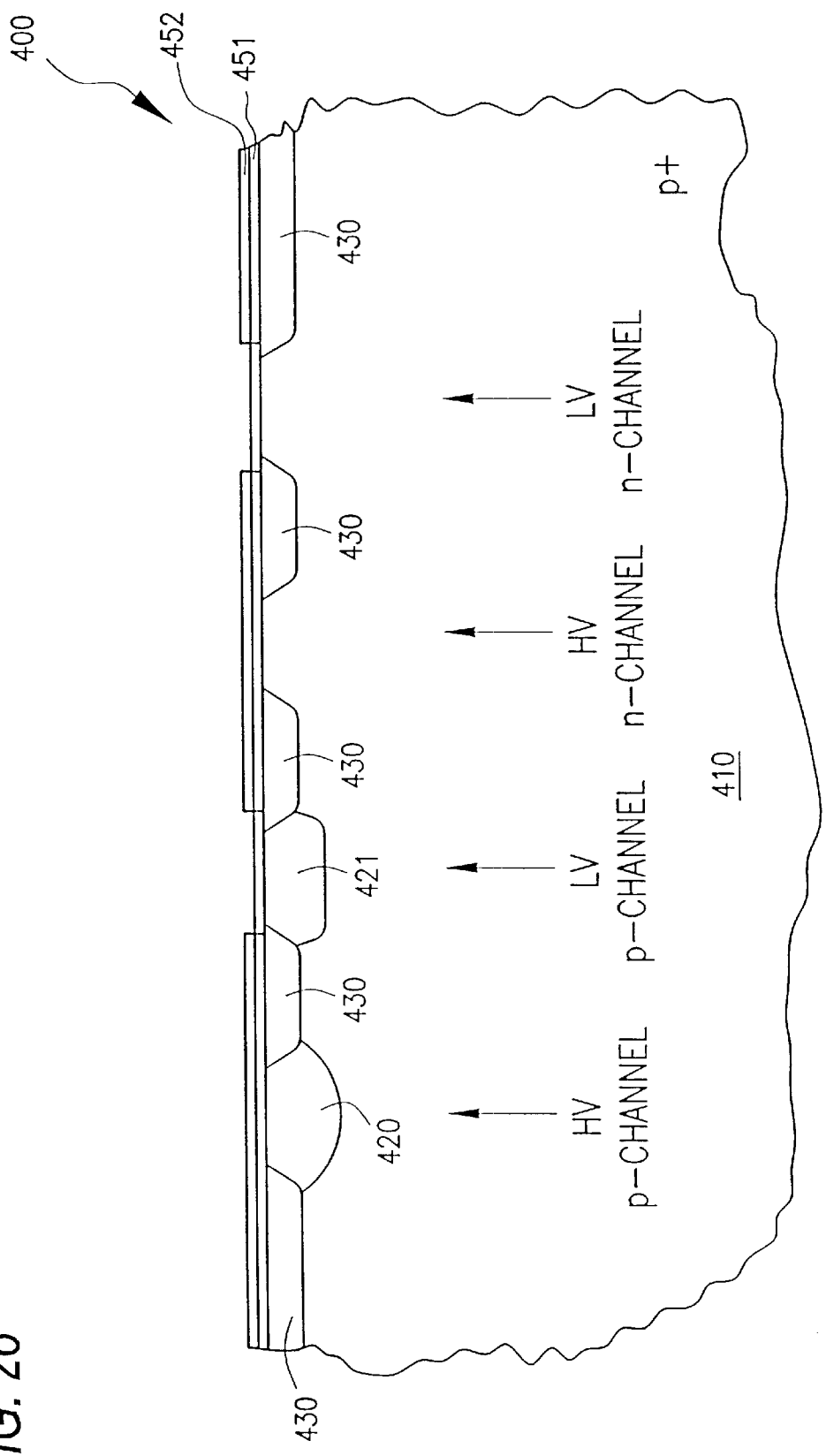
FIG. 26 is a cross sectional diagram of the integrated circuit portion of FIG. 25 at a later stage of fabrication.
Figure 27:
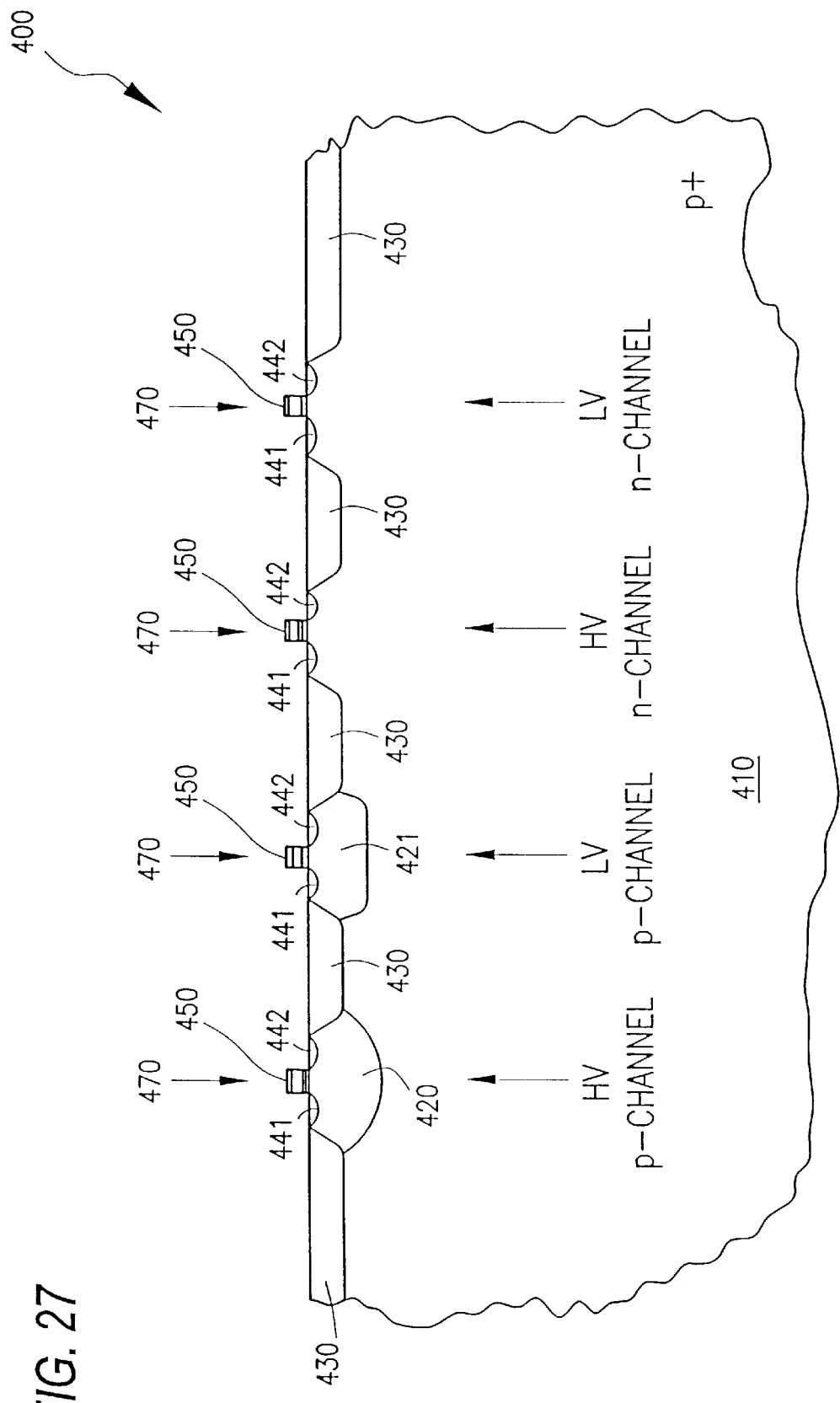
FIG. 27 is a cross sectional diagram of the integrated circuit portion of FIG. 26 at a later stage of fabrication.

Next, the exposed areas corresponding to the openings 477 are doped such that the gate threshold of both the low voltage and high voltage n-channel devices is at the proper value. Then the third mask 476 is removed, and a second oxide layer 452 is grown as shown in FIG. 26. Gate differentiation is now complete. Again, conventional back end processing is performed to form gate stacks 450, source areas 441 and drain areas 442 to complete the transistors 470 as shown in FIG. 27 Further processing, such as interconnection/metallization and passivation which are all well-known in the art, is also conventional and hence will not be discussed in further detail herein.

An efficient fabrication method for producing a structure with two different types of wells has been shown. This method requires only three masks to complete processing to the gate oxide differentiation step. In a preferred embodiment, the different well types are diffusion n-wells and retrograde n-wells. However, the method is easily modified to form diffusion p-wells and retrograde p-wells in an n-type substrate. Additionally, the method is applicable in situations where not all device types are required. For example, in the preferred embodiment, the method does not depend upon whether high voltage n-channel transistors are required.

While the invention has been described in detail in connection with the preferred embodiments known at the time, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Accordingly, the invention is not to be seen as limited by the foregoing description, but is only limited by the scope of the appended claims.

What is claimed as new and desired to be protected by Letters Patent of the United States is:

1. A method of masking a semiconductor substrate to form high and low voltage devices comprising:

applying a first mask over a first surface of said substrate, said mask including a first aperture;

doping a first region of said substrate through said first aperture;

removing said first mask from over said first surface;

applying a second mask over said first surface, said second mask including a second aperture;

doping a second region of said substrate through said second aperture, said first and second regions being non-intersecting regions;

redoping said second region of said substrate through said second aperture;

removing said second mask from over said first surface;

applying a third mask over said first surface, said third mask including third and fourth apertures, said third aperture being disposed over said first region and said fourth aperture being disposed over said second region;

doping a portion of said first region aligned with said third aperture and doping a portion of said second region aligned with said fourth aperture;

removing said third mask from over said first surface;

forming first and second electronic devices in said first and second regions respectively; and forming a third electronic device in said portion of said second region aligned with said fourth aperture.

2. A method as defined in claim 1 further comprising:

thermally processing said substrate after said doping said first region and prior to said doping said second region to form a diffusion well within said first region.

3. A method as defined in claim 1 wherein said doping of said first region includes implanting ions into said first region at an energy of approximately 200 keV.

4. A method as defined in claim 1 wherein said doping of said second region includes implanting ions into said second region at an energy of greater than approximately 240 keV to form a retrograde well within said second region.

5. A method of processing a semiconductor substrate with three masks to form plural differentiated transistor gate regions comprising:

forming a first mask on a first surface of said substrate, said first mask including a first opening exposing a first area of said first surface for a diffusion well;

implanting a first plurality of ions into said substrate through said first opening;

removing said first mask from said first surface of said substrate;

heating said substrate to diffuse said first plurality of ions within said substrate;

forming an isolation region on said substrate at said first surface;

growing an oxide layer over said substrate above said first surface;

forming a second mask on said oxide layer above said first surface of said substrate including a second opening exposing a second area of said oxide layer for a retrograde well;

implanting a second plurality of ions into said substrate through said second opening to form said retrograde well;

doping said substrate within said retrograde well through said second opening removing said second mask;

forming a third mask having a plurality of further openings therein on said oxide layer above said first surface, one of said further openings being disposed above said first area and another of said further openings being disposed above said second area;

stripping said oxide layer within said plurality of further openings; and doping said substrate through said plurality of further openings to form said plural differentiated transistor gate regions.

6. A method of processing a semiconductor substrate as defined in claim 5 wherein said doping said substrate within said retrograde well includes excessive doping of said substrate.

7. A sequence of three semiconductor manufacturing masks comprising:

a first mask, including a first opening, adapted to be deposited on a first surface of a semiconductor substrate, said first opening adapted to expose a first area of said semiconductor substrate to a first source of implantation ions;

a second mask, including a second opening, adapted to be deposited above said first surface of said semiconductor substrate, said second opening adapted to expose a second area of said semiconductor substrate to a second source of implantation ions, said second opening further adapted to expose said second area to a first source of doping ion; and a third mask, including third and fourth openings, adapted to be deposited above said first surface of said semiconductor substrate, said third and fourth openings adapted to expose respective portions of said first and second areas to a second source of doping ions, said first second and third mask adapted to be applied to said semiconductor substrate sequentially.

8. A method of forming a solid state device comprising:

masking a semiconductor substrate in a first pattern defining a first well area and exposing said semiconductor substrate to a first source of a first plurality of ions;

thereafter, de-masking said semiconductor substrate and heating said semiconductor substrate to diffuse said first plurality of ions within said first well area;

thereafter, forming an isolation region on said thereafter substrate;

thereafter, growing an oxide layer over said semiconductor substrate;

thereafter, re-masking said semiconductor substrate and said oxide layer in a second pattern defining a second well area and exposing said semiconductor substrate to a second source of a second plurality of ions;

thereafter, exposing said semiconductor substrate to a third source of doping ions;

thereafter, de-masking said semiconductor substrate;

thereafter, re-masking said semiconductor substrate in a third pattern defining first and second regions including said first and second well areas respectively;

thereafter, stripping said two respective portions of said oxide within said first and second regions respectively; and exposing said semiconductor substrate to a fourth source of doping ions so as to dope said substrate within said first and second regions respectively.

* * * * *

UNITED STATES PATENT AND TRADEMARK OFFICE
CERTIFICATE OF CORRECTION

PATENT NO. : 6,647,542 B2
DATED : November 11, 2003
INVENTOR(S) : Mark A. Helm

It is certified that error appears in the above-identified patent and that said Letters Patent is hereby corrected as shown below:

<u>Column 2,</u>
Line 2, change "structure one" to -- structure on one --;

<u>Column 8,</u>
Line 30, change "ion;" to -- ions; --;
Line 36, change "first second" to -- first, second --;
Line 36, change "mask" to -- masks --; and
Line 46, change "said thereafter" to -- said semiconductor --.

Signed and Sealed this

Third Day of February, 2004

JON W. DUDAS
*Acting Director of the United States Patent and Trademark Office*